United States Patent
Seibald et al.

(10) Patent No.: US 10,519,371 B2
(45) Date of Patent: *Dec. 31, 2019

(54) PHOSPHOR, ILLUMINATION DEVICE AND USE OF AN ILLUMINATION DEVICE

(71) Applicant: OSRAM Opto Semiconductors GmbH, Regensburg (DE)

(72) Inventors: Markus Seibald, Kaufering (DE); Dominik Baumann, Munich (DE); Thorsten Schroeder, Munich (DE); Stefan Lange, Augsburg (DE); Gregor Hoerder, Innsbruck (AT); Gina Maya Achrainer, Greifenberg (DE); Hubert Huppertz, Innsbruck (AT); Simon Peschke, Assling (DE); Alexey Marchuk, Munich (DE); Philipp Schmid, Germering (DE); Franziska Hummel, Munich (DE); Stephanie Dirksmeyer, Schwabmuenchen (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/324,924

(22) PCT Filed: Nov. 10, 2017

(86) PCT No.: PCT/EP2017/078913
§ 371 (c)(1),
(2) Date: Feb. 12, 2019

(87) PCT Pub. No.: WO2018/087304
PCT Pub. Date: May 17, 2018

(65) Prior Publication Data
US 2019/0316035 A1  Oct. 17, 2019

(30) Foreign Application Priority Data

| Nov. 11, 2016 | (DE) | 10 2016 121 692 |
| Nov. 11, 2016 | (DE) | 10 2016 121 694 |
| Aug. 10, 2017 | (WO) | PCT/EP2017/070329 |
| Aug. 10, 2017 | (WO) | PCT/EP2017/070343 |

(51) Int. Cl.
C09K 11/08 (2006.01)
C09K 11/77 (2006.01)
H01L 33/50 (2010.01)

(52) U.S. Cl.
CPC ...... C09K 11/7734 (2013.01); C09K 11/0883 (2013.01); H01L 33/502 (2013.01)

(58) Field of Classification Search
CPC .............. H01L 33/502; C09K 11/7734; C09K 11/0883
See application file for complete search history.

(56) References Cited

U.S. PATENT DOCUMENTS

| 9,028,716 | B2 | 5/2015 | Winkler et al. | |
| 9,157,025 | B2 | 10/2015 | Winkler et al. | |
| 2002/0190240 | A1 | 12/2002 | Feldmann et al. | |
| 2006/0244358 | A1 | 11/2006 | Kim et al. | |
| 2007/0166218 | A1* | 7/2007 | Hirosaki | C01B 21/0826 423/325 |
| 2008/0224596 | A1 | 9/2008 | Park et al. | |
| 2012/0019126 | A1* | 1/2012 | Porob | C09K 11/0883 313/503 |
| 2013/0020533 | A1* | 1/2013 | Fujinaga | C09K 11/7734 252/301.4 F |
| 2013/0127333 | A1* | 5/2013 | Jia | C09K 11/7731 313/503 |
| 2013/0140981 | A1 | 6/2013 | Huber et al. | |
| 2014/0049155 | A1 | 2/2014 | Kurtin | |
| 2014/0140055 | A1 | 5/2014 | Chen et al. | |
| 2014/0159584 | A1 | 6/2014 | Grajcar | |
| 2015/0109602 | A1 | 4/2015 | Martin et al. | |
| 2015/0123155 | A1 | 5/2015 | Schmidt et al. | |
| 2017/0040501 | A1 | 2/2017 | Choi et al. | |
| 2017/0186911 | A1 | 6/2017 | Otto et al. | |
| 2017/0186922 | A1 | 6/2017 | Kim et al. | |
| 2017/0294561 | A1 | 10/2017 | Ikeda et al. | |
| 2018/0127648 | A1 | 5/2018 | Hirosaki | |
| 2018/0148644 | A1 | 5/2018 | Seibald et al. | |

FOREIGN PATENT DOCUMENTS

| DE | 202008018060 U1 | 5/2011 |
| DE | 112011102173 T5 | 3/2013 |
| DE | 102015107580 A1 | 11/2016 |
| DE | 102017205819 A1 | 10/2017 |
| EP | 2104149 A1 | 9/2009 |
| EP | 2428543 B1 | 3/2012 |
| EP | 2585554 B1 | 8/2016 |
| WO | 2012073177 A1 | 6/2012 |
| WO | 2013175336 A1 | 11/2013 |
| WO | 2016177890 A1 | 11/2016 |

OTHER PUBLICATIONS

International Search Report issued for international counterpart application PCT/EP2018/080607, dated Feb. 14, 2019 (for reference purpose only).
German Search Report issued for German counterpart application 10 2018 205 464.9, dated Feb. 8, 2019 (for reference purpose only).
Nowitzki,B; Hoppe R, Neues über Oxide vom Typ A [(TO)n][1]:NaLi3SiO4, NaLi3GeO4 und NaLi3TiO4 [2].Revuede chimie minerale, dated 1986, p. 217-230.

(Continued)

Primary Examiner — Ahmed N Sefer
(74) Attorney, Agent, or Firm — Viering, Jentschura & Partner MBB

(57) ABSTRACT

A luminescent material may include the formula $(MB)(TA)_{3-2x}(TC)_{1+2x}O_{4-4x}N_{4x}$:E where $0<x<0.875$. —TA may be selected from a group of monovalent metals, such as Li, Na, Cu, Ag, and combinations thereof. —MB may be selected from a group of divalent metals including Mg, Ca, Sr, Ba, Zn, and combinations thereof. —TC may be selected from a group of trivalent metals including B, Al, Ga, In, Y, Fe, Cr, Sc, rare earth metals, and combinations thereof. —E may be selected from a group including Eu, Mn, Ce, Yb, and combinations thereof.

18 Claims, 16 Drawing Sheets

(56) References Cited

OTHER PUBLICATIONS

K. Werthmann, R. Hoppe, Über Oxide des neuen Formeltyps A[(T404)]: Zur Kenntnis von KLi3GeO4, KLi3SiO4 und KLi3TiO4, Z. Anorg. Allg. Chem., 1984, 509, 7-22.

Pejchal Jan et al, "Improvement of the growth of Li4SiO4single crystals for neutron detection and their scintillation and luminescence properties", Journal of Crystal Growth, Elsevier, Feb. 12, 2016, (pp. 143-150), Amsterdam; NL.

Pust et al.,"Narrow-Band Red-Emitting Sr[LiAl3N4]:Eu2+ as a Next-Generation LED-Phosphor Material", Nature materials, 2014, pp. 891-896.

German Search Report based on 10 2016 121 692.5 (9 pages) dated Jun. 19, 2017 (for reference purpose only).

International Search Report based on PCT/EP2017/070329 (3 pages) dated Nov. 10, 2017 (for reference purpose only).

J. Hofmann, R. Brandes, R. Hoppe, Neue Silicate mit Stuffed Pyrgoms: CsKNaLi9{Li[SiO4]}4, CsKNa2Li8{Li[SiO4]}4, RbNa3Li8{Li[SiO4]}4, und RbNaLi4{Li[SiO4]}4, Z. Anorg. Allg. Chem., 1994, 620, 1495-1508.

C. Weiß, R. Hoppe, Das erste Titanat mit Stuffed Pyrgoms: RbNa3Li12[TiO4]4=RbNa3Li8{Li[TiO4]}4, Z. Anorg. Allg. Chem., 1994, 620, 2064-2069.

R. Brandes, R. Hoppe, Das erste Oxogermanat mit Stuffed Pyrgoms: CsNa3Lis8{Li[GeO4]}4, Z Anorg. Allg. Chem., 1995, 621, 713-718.

K. Bernet, R. Hoppe, Ein Lithosilicat mit Kolumnareinheiten: RbLi5{Li[SiO4]}2, Z. Anorg. Allg. Chem., 1991, 592, 93-105.

Lucas et al., Measuring and using light in the melanopsin age, Trends in Neurosciences Jan. 2014 vol. 37 No. 1.

P. Pust, A. S. Wochnik, E. Baumann, P. J. Schmidt, D. Wiechert, C. Scheu, W. Schnick, Ca[LiAl3N4]:Eu2+—A Narrow-Band Red-Emitting Nitridolithoaluminate Chemistry of Materials 2014 26, 3544-3549.

Pust, P. et al., "Group (III) Nitrides M[Mg2Al2N4] (M = Ca,Sr,Ba,Eu) and Ba[Mg2Ga2N4]—Structural Relation and Nontypical Luminescence Properties of Eu2+ Doped Samples", Chem. Mater., 2014, 26, 6113-6119.

Wilhelm D. et al., "Narrow-Band Red Emission in the Nitridolithoaluminate Sr4[LiAl11N14):Eu2+", Chemistry of Materials, 2017, 29, p. 1204.

Wagatha P. et al., "Ca18.75Li10.5[Al39N55]:Eu2+—Supertetrahedron Phosphor for Solid-State Lighting", Chemistry of Materials, 2016, 28, p. 1220.

German Search Report based on 10 2016 121 694.1 (9 pages) dated Jul. 7, 2017 (for reference purpose only).

International Search Report based on PCT/EP2017/070343 (4 pages) dated Nov. 10, 2017 (for reference purpose only).

International Search Report based on PCT/EP2017/078913 (3 pages) dated Feb. 22, 2018 (for reference purpose only).

International Search Report issued for international counterpart application PCT/EP2018/053416, dated May 2, 2018 (for reference purpose only).

US Office Action based on U.S. Appl. No. 16/198,812, dated Aug. 6, 2019, 35 pages (for reference purpose only).

German Search Report based on Application No. 10 2018 108 842.6, dated Dec. 11, 2018, 6 pages (for reference purpose only).

Notice of Allowance based on U.S. Appl. No. 16/302,724 (9 pages) dated Sep. 30, 2019 (for reference purpose only).

\* cited by examiner

FIG 6A

| F | SrLi$_2$Al$_2$O$_2$N$_2$ |
|---|---|
| m | 215.48 |
| C | tetr. |
| S | P4$_2$/m (no 84) |
| a/Å | 7.959(2) |
| c/Å | 3.1843(12) |
| Vc / Å$^3$ | 201.71(13) |
| d / g x cm$^{-3}$ | 3.548 |
| T / K | 293(2) |
| R | Cu-Kα(λ=1.542Å) |
| M | 5.6<θ<71.9 |
| | -9 ≤ h ≤ 9 |
| | -9 ≤ k ≤ 9 |
| | -3 ≤ l ≤ 3 |
| RT | 1534 |
| IR | 234 |
| NP | 26 |
| R$_{int}$ | 0.049 |
| R$_1$, wR$_2$ (I ≥ 2σ I) | 0.0336, 0.0857 |
| GooF | 1.19 |

FIG 6B

| A | x | y | z | O | $U_{iso}$ |
|---|---|---|---|---|---|
| Sr01 | 1/2 | 1 | 1/2 | 1 | 0.0180(3) |
| Al02 | 0.3533(3) | 0.6842(3) | 0 | 1 | 0.0168(6) |
| O03 | 0.2546(6) | 0.8935(6) | 0 | 1 | 0.0173(14) |
| N04 | 0.5855(7) | 0.7299(7) | 0 | 1 | 0.0140(19) |
| Li05 | 0.1308(12) | 0.8208(12) | -1/2 | 1 | 0.0044(18) |

FIG 6C

| A | $U_{11}$ | $U_{22}$ | $U_{33}$ | $U_{23}$ | $U_{13}$ | $U_{12}$ |
|---|---|---|---|---|---|---|
| Sr01 | 0.0160(5) | 0.0133(5) | 0.0247(6) | 0 | 0 | -0.0007(3) |
| Al02 | 0.0134(10) | 0.0117(10) | 0.0252(12) | 0 | 0 | -0.0014(8) |
| O03 | 0.017(2) | 0.009(2) | 0.026(3) | 0 | 0 | -0.0004(18) |
| N04 | 0.011(3) | 0.013(3) | 0.018(4) | 0 | 0 | 0.002(2) |

FIG 7

| FIG 7A | FIG 7B | FIG 7C | FIG 7D |

FIG 7A

| Solution | A1 | V1 | A2 | V2 |
|---|---|---|---|---|
| λd/nm | 451 | 451 | 448 | 448 |
| L2 | $Y_3(Al,Ga)_5O_{12}$:Ce (40% Ga, 2% Ce) | $Y_3(Al,Ga)_5O_{12}$:Ce (40% Ga, 2% Ce) | $Lu_3(Al,Ga)_5O_{12}$:Ce (25% Ga, 2.5% Ce) | $Lu_3(Al,Ga)_5O_{12}$:Ce (25% Ga, 2.5% Ce) |
| L, L3 | $SrLi_2Al_2O_2N_2$:Eu | $CaAlSiN_3$:Eu | $SrLi_2Al_2O_2N_2$:Eu | $CaAlSiN_3$:Eu |
| CIE-x | 0,437 | 0,437 | 0,437 | 0,437 |
| CIE-y | 0,404 | 0,404 | 0,404 | 0,404 |
| CCT / K | 3000 | 3000 | 3000 | 3000 |
| CRI | 90 | 92 | 91 | 93 |
| R9 | 20 | 73 | 27 | 78 |
| LER / lm/W | 349 | 284 | 342 | 281 |
| Rel. LER | 123% | 100% | 122% | 100% |

FIG 7B

| | A3 | V3 | A4 | V4 | A5 |
|---|---|---|---|---|---|
| | 448 | 448 | 448 | 448 | 453 |
| | Lu$_3$(Al,Ga)$_5$O$_{12}$:Ce (25% Ga, 2% Ce) | Lu$_3$(Al,Ga)$_5$O$_{12}$:Ce (25% Ga, 2% Ce) | Lu$_3$Al$_5$O$_{12}$:Ce (1% Ce) | Lu$_3$Al$_5$O$_{12}$:Ce (1% Ce) | (Lu,Y)$_3$Al$_5$O$_{12}$:Ce (20% Y, 3.5% Ce) |
| | SrLi$_2$Al$_2$O$_2$N$_2$:Eu | CaAlSiN$_3$:Eu | SrLi$_2$Al$_2$O$_2$N$_2$:Eu | CaAlSiN$_3$:Eu | SrLi$_2$Al$_2$O$_2$N$_2$:Eu |
| | 0,437 | 0,437 | 0,437 | 0,437 | 0,437 |
| | 0,404 | 0,404 | 0,404 | 0,404 | 0,404 |
| | 3000 | 3002 | 3000 | 3000 | 3000 |
| | 94 | 96 | 91 | 92 | 82 |
| | 40 | 97 | 27 | 82 | 3 |
| | 339 | 272 | 343 | 277 | 350 |
| | 124% | 100% | 124% | 100% | 117% |

FIG 7C

| | V5 | A6 | V6 | A7 | V7 |
|---|---|---|---|---|---|
| | 453 | 450 | 450 | 448 | 448 |
| | (Lu,Y)$_3$Al$_5$O$_{12}$:Ce (20% Y, 3.5% Ce) | Y$_3$(Al,Ga)$_5$O$_{12}$:Ce (25% Ga, 4% Ce) | Y$_3$(Al,Ga)$_5$O$_{12}$:Ce (25% Ga, 4% Ce) | — | — |
| | CaAlSiN$_3$:Eu | SrLi$_2$Al$_2$O$_2$N$_2$:Eu | CaAlSiN$_3$:Eu | SrLi$_2$Al$_2$O$_2$N$_2$:Eu | CaAlSiN$_3$:Eu |
| | 0,437 | 0,437 | 0,437 | 0,652 | 0,665 |
| | 0,404 | 0,404 | 0,404 | 0,334 | 0,323 |
| | 3000 | 3000 | 3000 | — | — |
| | 84 | 80 | 82 | — | — |
| | 44 | 1 | 38 | — | — |
| | 299 | 348 | 303 | 249 | 121 |
| | 100% | 115% | 100% | 205% | 100% |

FIG 7D

| | A8 | A9 | A10 |
|---|---|---|---|
| | 448 | 451 | 451 |
| | $Lu_3(Al,Ga)_5O_{12}$:Ce (25% Ga, 2% Ce) + $Y_3Al_5O_{12}$:Ce (2% Ce) | $Y_3(Al,Ga)_5O_{12}$:Ce (40% Ga, 2% Ce) | $Y_3(Al,Ga)_5O_{12}$:Ce (40% Ga, 2% Ce) |
| | $SrLi_2Al_2O_2N_2$:Eu | $SrLi_2Al_2O_2N_2$:Eu + CaAlSiN$_3$:Eu | $SrLi_2Al_2O_2N_2$:Eu + SrLiAl$_3$N$_4$:Eu |
| | 0,437 | 0,437 | 0,437 |
| | 0,404 | 0,404 | 0,404 |
| | 3000 | 3000 | 3000 |
| | 90 | 91 | 93 |
| | 25 | 50 | 52 |
| | 344 | 310 | 323 |
| | — | — | — |

PHOSPHOR, ILLUMINATION DEVICE AND USE OF AN ILLUMINATION DEVICE

CROSS-REFERENCE TO RELATED APPLICATION

The present application is a national stage entry according to 35 U.S.C. § 371 of PCT application No.: PCT/EP2017/078913 filed on Nov. 10, 2017, which claims priority from PCT Application No. PCT/EP2017/070343 and PCT Application No. PCT/EP2017/070329 which were both filed on Aug. 10, 2017; which claims priority from German Patent Application Serial No.: 10 2016 121 692.5 and German Patent Application Serial No.: 10 2016 121 694.1, which were both filed on Nov. 11, 2016; all of which are incorporated herein by reference in their entirety and for all purposes.

TECHNICAL FIELD

The disclosure relates to a phosphor, and more specifically relates to a lighting device including the phosphor.

BACKGROUND

Phosphors that can be efficiently excited with ultraviolet, blue or green primary radiation and have efficient emission in the blue, green, yellow, red or deep red spectral region are of very great interest for the production of white and colored conversion LEDs. Conversion LEDs are used for many applications, for example for general lighting, display backlighting, signage, display panels, in automobiles and in numerous further consumer products. Conversion LEDs for the backlighting of display elements, for example displays, differ significantly from conversion LEDs for general lighting. The demands on conversion LEDs for general lighting are especially a high light yield combined with a high efficiency, a high color rendering index and specific color temperatures (e.g. below 3500 K for what is called warm white light or, for example, 6500 K for what is called cold white light). For conversion LEDs for backlighting of display elements, particularly phosphors having narrowband emissions in the blue, green and red spectral region are required in order to cover a color space of maximum breadth. Moreover, there is great demand for colored conversion LEDs that render colors matched to consumer wishes (called "color on demand" applications).

Existing white-emitting conversion LEDs for general lighting and backlighting use a semiconductor chip that emits blue primary radiation and a red and green phosphor. A disadvantage of this solution is that the epitaxially grown semiconductor chips, based, for example, on GaN or InGaN, can have variations in the peak wavelength of the primary radiation emitted. This leads to variations in the white overall radiation, such as a change in the color locus and the color rendering, since the primary radiation contributes the blue component to the overall radiation. This is problematic particularly in the case of use of multiple semiconductor chips in one device.

In order to prevent variations, the semiconductor chips are sorted in accordance with their color loci ("binning"). The narrower the tolerances set with regard to the wavelength of the primary radiation emitted, the higher the quality of conversion LEDs consisting of more than one semiconductor chip. But even after sorting with narrow tolerances, the peak wavelength of the semiconductor chips can change significantly at variable operating temperatures and forward currents. In general lighting and other applications, this can lead to a change in the optical properties, such as the color locus and color temperature.

In the backlighting of display elements, such as displays in televisions, computer monitors, tablets and smartphones, manufacturers are trying to render the colors in a lively and true-to-life manner, since this is very attractive to consumers. For the backlighting of display elements, therefore, light sources with very narrow-band emissions, i.e. a small half-height width, in the green, blue and red spectral region are required to cover a color space of maximum breadth. As light sources for backlighting applications, it is predominantly the case that a blue-emitting semiconductor chip is combined with a phosphor having a peak wavelength in the green and a phosphor having a peak wavelength in the red spectral region.

Conversion LEDs for backlighting applications conventionally use, as green phosphor, for example, an yttrium aluminum garnet, a lutetium aluminum garnet or a β-SiAlON ($Si_{6-z}Al_zO_zN_{8-z}$:RE or $Si_{6-x}Al_zO_yN_{8-y}$:$RE_z$ with RE=rare earth metal). However, yttrium aluminum garnet has an emission peak having a large half-height width, and so the achievable color space is restricted by considerable filter losses and the efficiency is also lowered. β-SiAlON, with a half-height width of below 60 nm, has narrow-band emission in the green spectral region that leads to more saturated green rendering than with a garnet phosphor. However, the β-SiAlONes lack good internal and external quantum efficiency, which makes the overall backlighting comparatively inefficient. Furthermore, the production of these phosphors requires very high temperatures and complex equipment. Thus, the phosphor is very costly to produce, and hence so are the conversion LEDs including this phosphor.

Quantum dots, owing to their very narrow-band emission, are also used for conversion of primary radiation for backlighting applications. However, quantum dots are very unstable.

Moreover, most commercially available quantum dots include harmful elements such as Hg or Cd, the concentration of which in commercial electrical and electronic devices is limited under the RoHS regulations ("reduction of hazardous substances", EU Directive 2011/65/EU).

Known blue-green to green phosphors for conversion LEDs are, for example, the phosphors $Ca_8Mg(SiO_4)_4Cl_2$:Eu, $(Sr, Ba)_2SiO_4$:Eu and $Lu_3(Al,Ga)_5O_{12}$:Ce. However, conversion LEDs including these phosphors have inadequate color purity and cannot attain particular color loci, and they are therefore not an option for many "color on demand" applications.

Lighting devices, for example white light-emitting diodes, can be used as backlighting. For this purpose, red-emitting phosphors are generally needed. However, the use of red-emitting phosphors in lighting devices is limited to a few phosphors, for example to nitridosilicate phosphors, for example $(Ca, Sr, Ba)_2Si_5Ne$:Eu, and nitridoalumosilicate phosphors, for example $(Ca,Sr)AlSiN_3$:Eu. However, these phosphors show a number of disadvantages in relation to color space coverage, spectral position, half-height width (FWHM) and the overlap region with conventional filter units for backlighting. In the case of use of $(Ca,Sr,Ba)_2Si_5N_8$:Eu, the shift in the emission wavelength from the orange to the red spectral region can be effected by substitution of barium for strontium and/or calcium. The result is a phosphor, but one that is very unstable. In addition, phosphors having a high dominant wavelength ($\lambda_{dom}$) with values of more than 605 nm have a very high half-height width. This leads to a low-efficiency phosphor and low color saturation. Nitridoalumosilicate phosphors typically show a dominant wavelength of up to 608 nm, but a broad emission spectrum and hence low luminescence efficiency.

Phosphors that emit in the red spectral region and have an emission spectrum having a small half-height width are therefore of great interest, especially in the case of use in lighting devices, for example backlighting.

SUMMARY

The description relates to a phosphor that emits radiation in the red spectral region and has a small half-height width. A lighting device may include the advantageous phosphor described here. The lighting device may be used for backlighting of display devices, especially of displays.

In at least one non-limiting embodiment, the phosphor has the formula $$(MB)(TA)_{3-2x}(TC)_{1+2x}O_{4-4x}N_{4x}:E.$$

TA is selected from a group of monovalent metals. In particular, TA is selected from a group including the monovalent metals lithium, sodium, copper, silver and combinations thereof. In particular, TA is lithium.

MB is selected from a group of divalent metals. In particular, MB is selected from a group including the divalent metals magnesium, calcium, strontium, barium, zinc and combinations thereof. MB may be or include calcium, strontium, barium, or a combination thereof. In a non-limiting embodiment, MB is strontium.

TC is selected from a group of trivalent metals. In particular, TC is selected from a group including the trivalent metals boron, aluminum, gallium, indium, yttrium, iron, chromium, scandium, rare earth metals and combinations thereof. In particular, TC is aluminum.

E is selected from a group including europium, manganese, cerium, ytterbium and combinations thereof. In particular, E is $Eu^{3+}$, $Eu^{2+}$, $Ce^{3+}$, $Yb^{3+}$, $Yb^{2+}$ and/or $Mn^{4+}$.

$0<x<0.875$. In particular, $0.45<x<0.55$. In a non-limiting embodiment, $x=0.5$.

In at least one embodiment, the phosphor has the formula $$(MB)Li_{3-2x}Al_{1+2x}O_{4-4x}N_{4x}:E.$$

MB is selected from a group of divalent metals. In particular, MB is selected from a group including magnesium, calcium, strontium, barium, zinc and combinations thereof. In a non-limiting embodiment, MB may be or include calcium, strontium, barium, or a combination thereof. Alternatively, MB is strontium. E is selected from a group including europium, manganese, cerium, ytterbium and combinations thereof. In particular, E is $Eu^{3+}$, $Eu^{2+}$, $Ce^{3+}$, $Yb^{3+}$, $Yb^{2+}$ and/or $Mn^{4+}$. $0<x<0.875$. In particular, $0.45<x<0.55$. Alternatively, $x=0.5$.

Here and hereinafter, phosphors are described by empirical formulae. It is possible in the empirical formulae specified that the phosphor includes further elements, for instance in the form of impurities, where these impurities together have not more than a proportion by weight in the phosphor of 1‰ or 100 ppm (parts per million) or 10 ppm.

The half-height width is understood here and hereinafter to mean the spectral width at half the maximum height of the emission peak, FWHM or full width at half maximum for short. The emission peak is understood to mean the peak having the maximum intensity.

The use of the activators Eu, Ce, Yb and/or Mn, especially Eu or Eu in combination with Ce, Yb and/or Mn, allows particularly good adjustment of the color locus of the phosphor in the CIE color space, the peak wavelength λpeak or dominant wavelength λdom thereof, and the half-height width.

The dominant wavelength is a way of describing non-spectral (polychromatic) light mixtures in terms of spectral (monochromatic) light that generates a similar perception of hue. In the CIE color space, the line that connects a point for a particular color and the point CIE-x=0.333, CIE-y=0.333 can be extrapolated such that it meets the outline of the space at two points. The point of intersection closer to said color represents the dominant wavelength of the color as the wavelength of the pure spectral color at this point of intersection. The dominant wavelength is thus the wavelength which is perceived by the human eye.

In the present context, the "peak wavelength" can refer to the wavelength in the emission spectrum at which the maximum intensity in the emission spectrum lies.

In a further embodiment, the activator E may be present in molar percentage amounts of 0.1 mol % to 20 mol %, 1 mol % to 10 mol %, 0.5 mol % to 5 mol %, 2 mol % to 5 mol %. Excessively high concentrations of E can lead to a loss of efficiency as a result of concentration quenching. Here and hereinafter, molar percentages for the activator E, especially Eu, are especially understood as molar percentages based on the molar proportion of MB in the phosphor.

In a further embodiment, MB may be present in molar percentage amounts of 80 mol % to 99.9 mol %.

In at least one embodiment, the phosphor crystallizes in the tetragonal $P4_2/m$ space group (No. 84).

In at least one embodiment, $x=0.5$. This results in the phosphor having the formula $(MB)Li_2Al_2O_2N_2:E$ where MB is selected from a group of divalent metals including magnesium, calcium, strontium, barium, zinc or combinations thereof, where E is selected from a group including europium, manganese, cerium, ytterbium and combinations thereof. In particular, the phosphor is $SrLi_2Al_2O_2N_2:Eu$.

In at least one embodiment, the phosphor emits electromagnetic radiation from the red spectral region. In particular, the phosphor emits radiation having a dominant wavelength between 590 nm and 620 nm inclusive, such as between 595 nm and 615 nm inclusive, such as between 600 nm and 610 nm inclusive.

For example, the phosphor of the formula $SrLi_2Al_2O_2N_2$:Eu, on excitation with primary radiation having a wavelength of 460 nm, emits in the red spectral region of the electromagnetic spectrum and shows narrow-band emission, i.e. emission having a small half-height width, such as having a half-height width of less than 50 nm.

In at least one embodiment, the phosphor has an emission spectrum having a maximum peak wavelength of 614 nm+/– 10 nm, 9 nm, 8 nm, 7 nm, 6 nm, 5 nm, 4 nm, 3 nm, 2 nm or 1 nm and/or a half-height width of less than 70 nm, less than 65 nm or less than 60 nm, especially less than 55 nm, such as less than 50 nm, for example 48 nm.

In at least one embodiment, the half-height width is less than 55 nm, such as less than 50 nm, for example less than or equal to 45 nm.

In at least one embodiment, the phosphor does not crystallize in the I4/m space group or the crystal structure of the $UCr_4C_4$ type.

In at least one embodiment, MB is calcium, strontium and/or barium. In particular, MB is a combination of calcium, strontium and/or barium. In at least one embodiment, MB is strontium.

In at least one embodiment, E is europium.

In at least one embodiment, the phosphor is excitable with primary radiation from the UV and/or blue spectral region. For example, the phosphor is excitable with a wavelength of 460 nm+/−10%.

The phosphor is especially a europium-doped lithium oxonitridoaluminate phosphor.

The phosphor can be prepared by means of solid-state reaction.

For this purpose, the reactants for the phosphor can be blended. For example, it is possible to use strontium nitride ($Sr_3N_2$), aluminum nitride (AlN), aluminum oxide ($Al_2O_3$), lithium nitride ($Li_3N$) and europium oxide ($Eu_2O_3$) for preparation of $SrLi_2Al_2O_2N_2$:Eu. The reactants are blended with one another in an appropriate ratio. The reactants can be introduced, for example, into a nickel crucible. Subsequently, the blend can be heated up to a temperature between 700° C. and 1000° C., such as 800° C. In addition, the heating can be effected in a forming gas stream, maintaining the temperatures over 1 to 400 hours. The proportion of hydrogen ($H_2$) in the nitrogen ($N_2$) may, for example, be 7.5%.

The heating and cooling rates may, for example, be 250° C. per hour.

As an alternative to the process described above, the phosphor can also be produced by a solid-state synthesis in a tantalum ampoule that has been welded shut. For this purpose, the reactants, for example $Sr_3Al_2O_6$, Li (flux), $LiN_3$ and $Eu_2O_3$ in the case of the $SrLi_2Al_2N_2O_2$:Eu phosphor, may be blended with one another in an appropriate mixing ratio and introduced into a tantalum ampoule. Heating is effected, for example, from room temperature to 800° C., then the temperature is maintained for 100 hours, for example, with subsequent cooling of the system back to room temperature and production of the phosphor.

In at least one embodiment, the reactants are in powder form.

In at least one embodiment, the heating step is followed by a cooling operation, wherein the blend is cooled down to room temperature. Room temperature may especially be understood to mean a temperature of 20° C. or 25° C.

In at least one embodiment, the temperature is kept at this value for 1 hour to 400 hours, for example 100 hours. In particular, the phosphor is calcined in this period.

The synthesis is effected at moderate temperatures and is therefore very energy-efficient. The demands on the oven used, for example, are thus low. The reactants are commercially available inexpensively and nontoxic.

A lighting device may include the phosphor. All details and definitions of the phosphor are also applicable to the lighting device, and vice versa.

In at least one embodiment, the lighting device includes a semiconductor layer sequence. The semiconductor layer sequence is set up for emission of electromagnetic primary radiation.

In at least one embodiment, the semiconductor layer sequence includes at least one III-V compound semiconductor material. The semiconductor material is, for example, a nitride compound semiconductor material, such as $Al_nIn_{1-n-m}Ga_mN$, or a phosphide compound semiconductor material, such as $Al_nIn_{1-n-m}Ga_mP$, or else an arsenide compound semiconductor material, such as $Al_nIn_{1-n-m}Ga_mAs$, where, in each case, $0 \leq n \leq 1$, $0 \leq m \leq 1$ and $n+m \leq 1$. This semiconductor layer sequence may include dopants and additional constituents. For the sake of simplicity, however, only the essential constituents of the semiconductor layer sequence, i.e. Al, As, Ga, In, N or P, are specified, even though these may be partly replaced and/or supplemented by small amounts of other substances. In particular, the semiconductor layer sequence is formed from InGaN.

The semiconductor layer sequence includes an active layer having at least one pn junction and/or having one or more quantum well structures. In the operation of the lighting device, electromagnetic radiation is produced in the active layer. One wavelength or the wavelength maximum of the radiation may be in the ultraviolet and/or visible region, especially at wavelengths between 360 nm and 550 nm inclusive, for example between 400 nm and 500 nm inclusive, especially between 420 nm and 480 nm inclusive.

In at least one embodiment, the lighting device is a light-emitting diode, LED for short, especially a conversion LED. In that case, the lighting device may be configured to emit white or colored light.

In one embodiment, the lighting device, especially the conversion LED, includes a primary radiation source set up to emit electromagnetic primary radiation in the operation of the lighting device, especially the conversion LED. The lighting device, especially the conversion LED, further includes a conversion element disposed in the beam path of the electromagnetic primary radiation. The conversion element includes a phosphor set up to at least partly convert the electromagnetic primary radiation to electromagnetic secondary radiation in the operation of the lighting device, especially the conversion LED. In combination with the phosphor present in the lighting device, the lighting device may be configured for emission of red light in full conversion and white light in partial conversion.

The active layer may take the form, for example, of a pn junction, of a double heterostructure, or of a single quantum well structure or multiple quantum well structure. The expression "quantum well structure" embraces any structure in which charge carriers experience quantization of their energy states by confinement. More particularly, the expression "quantum well structure" does not include any statement as to the dimensionality of the quantization. Thus, it includes, inter alia, quantum troughs, quantum wires and/or quantum dots and any combination of these quantum structures.

The blue or blue-green spectral region may especially be understood to mean the region of the electromagnetic spectrum between 420 nm and 520 nm.

The green spectral region may especially be understood to mean the region of the electromagnetic spectrum between 520 nm and 580 nm inclusive.

The red spectral region may be understood to mean the region of the electromagnetic spectrum between 610 nm and 780 nm.

The yellow or yellow-orange spectral region may especially be understood to mean the region of the electromagnetic spectrum between 580 nm and 610 nm.

The lighting device includes a conversion element. More particularly, the conversion element includes or consists of the phosphor. The phosphor at least partly or fully converts the electromagnetic primary radiation to electromagnetic secondary radiation.

In at least one embodiment, the overall radiation from the lighting device is white mixed radiation.

In at least one embodiment, the phosphor converts the electromagnetic primary radiation partly to electromagnetic secondary radiation. This can also be referred to as partial conversion. In that case, the overall radiation that exits from the lighting device is composed of the primary and secondary radiation, especially white mixed radiation.

In at least one embodiment, the conversion element, as well as the phosphor, includes a second, third, fourth and/or fifth phosphor.

For example, the phosphors are embedded in a matrix material.

Alternatively, the phosphors may also be present in a converter ceramic. For example, the second phosphor is set up for emission of radiation from the green spectral region.

Additionally or alternatively, the lighting device may include a third phosphor. The third phosphor may be set up to emit radiation from the red spectral region. In other words, the lighting device in that case includes at least three phosphors: two red-emitting phosphors and one green-emitting phosphor. The lighting device is therefore set up at least for partial conversion, where the primary radiation is selected from the blue spectral region. In that case, the resulting overall radiation from the lighting device is especially white mixed radiation.

In at least one embodiment, the lighting device takes the form of a lamp, especially of a lamp for a motor vehicle, such as of a rear light and/or brake light for a motor vehicle. More particularly, the overall radiation from the lighting device in that case is selected from the orange-red wavelength range.

The lighting device may be used for backlighting of display devices. For example, display devices may especially be displays.

Lighting devices for the backlighting of displays, for example of LCD displays, differ from light sources for general lighting. The demands on light sources for general lighting are, in particular, a high light yield combined with a continuous spectrum in order to achieve a high color rendering index. In the case of LCD displays ("liquid-crystal displays") and other displays, the colors are rendered by the primary colors red, green and blue. The range of colors that can be rendered in a display is therefore limited by the color triangle formed by the colors red, green and blue. These colors are correspondingly filtered out of the spectrum for the backlighting by red, green and blue color filters. However, the wavelength range of the radiation transmitted by the color filters is still very broad. Therefore, light sources having very narrow-band emissions, i.e. a small half-height width, in the green, blue and red spectral region are required to cover a color space of maximum breadth. Light sources combined for backlighting applications are primarily a blue-emitting semiconductor chip with a phosphor having a peak wavelength in the green and a phosphor having a peak wavelength in the red spectral region, the phosphors having a minimum half-height width of the emission. Ideally, the emission peaks coincide with the transmission region of the respective color filter, in order thus to lose as little light as possible, to achieve the maximum efficiency and to reduce crosstalk or overlap of the different color channels that limits the color space achievable.

In at least one embodiment, the phosphor has the formula $SrLi_2Al_2O_2N_2$:Eu and crystallizes in the tetragonal $P4_2/m$ space group. Although the crystal structure in the tetragonal $P4_2/m$ space group can be described as a superstructure of $UCr_4C_4$, the Bravais lattice types of these structures are different. Therefore, the phosphor described here does not crystallize in the crystal structure of $UCr_4C_4$. The $UCr_4C_4$ type can be described in the I4/m space group.

In single-crystal x-ray structure analysis, according to the symmetry of the crystal structure examined, not all theoretically possible reflections can always indeed truly be observed. In this present case, on the basis of the I4/m space group, in the $UCr_4C_4$ structure, it should not be possible to observe a reflection with the index 100 since 1+0+0 is odd (corresponds to the symmetry-related integral extinction conditions h+k+l≠2n (odd) for I-centered lattices). Since this reflection can be observed in the case of the phosphor, and it likewise crystallizes in a tetragonal space group, it is clear that the crystal structure does not have the same space group as the $UCr_4C_4$ structure.

By comparison with a phosphor having the space group of $UCr_4C_4$, the primitive lattice of the phosphor described here does not have any such extinction conditions and leads to the occurrence of additional reflections, for example with the index 100 at about 11.11° 2θ (for copper $K_{\alpha 1}$ radiation) with an interplanar distance (d value) of about 7.96 Å.

In at least one embodiment, the phosphor is $SrLi_2Al_2O_2N_2$:Eu and has secondary radiation from the red spectral region on excitation from the UV to blue spectral region of the primary radiation. More particularly, the phosphor has narrow-band emission with a small half-height width, such as less than 55 nm. The short dominant wavelength in combination with a small half-height width leads to a high luminescence efficiency of, for example, 266 $lm/W_{OPT}$ owing to the elevated overlap with the human eye sensitivity curve compared to the conventional red-emitting phosphors of comparable dominant wavelength. This in turn leads to a high-efficiency white-emitting lighting device with very good color rendering, especially for saturated red colors.

In at least one embodiment, the phosphor has at least one phase, especially more than one phase. More particularly, the one phase includes or consists of the europium-doped oxonitridolitho-aluminate phosphor described here.

The phosphor described here has a different crystal structure compared to $SrLiAl_3N_4$:$Eu^{2+}$, $CaLiAl_3N_4$:$Eu^{2+}$, $Sr_4LiAl_{11}N_{11}$:$Eu^{2+}$ and $Ca_{18.75}Li_{10.5}[Al_{39}N_{55}]$:$Eu^{2+}$. The phosphor described here, by comparison with the conventional phosphors, has different positions of the reflections in the x-ray powder diffractogram.

Only few lithium aluminate phosphors are known to date, for example solely $SrLiAl_3N_4$:$Eu^{2+}$, $CaLiAl_3N_4$:$Eu^{2+}$, $Sr_4LiAl_{11}N_{14}$:$Eu^{2+}$ and $Ca_{18.75}Li_{10.5}[Al_{39}N_{55}]$:$Eu^{2+}$.

In at least one embodiment, for example, the phosphor having the formula $SrLi_2Al_2N_2O_2$:Eu has the lattice parameters of a=7.952 (2) Å, c=3.1843 (12) Å, and crystallizes in a tetragonal $P4_2/m$ space group.

In at least one embodiment, the phosphor is capable of absorbing primary radiation from the blue spectral region and converting it to secondary radiation having a maximum of the emission band between 580 and 640 nm, especially between 600 nm and 620 nm. This results in an advantageous dominant wavelength $\lambda_{dom}$ of <620 nm, especially <610 nm, for example 606 nm.

Moreover, the phosphor has a small half-height width of <60 nm, such as <55 nm, such as <50 nm.

In addition, the phosphor may have a maximum peak wavelength of roughly or exactly 615 nm+/−10 nm, 9 nm, 8 nm, 7 nm, 6 nm, 5 nm, 4 nm, 3 nm, 2 nm or 1 nm.

The phosphor described here, by comparison with the phosphor known to date, such as $SrLiAl_3N_4$:$Eu^{2+}$, has an improved photometric radiation equivalent (LER). In other words, the emission of the phosphor described here, owing to the shorter-wave emission maximum, "overlaps" more significantly with the eye sensitivity curve in the red spectral region compared to a phosphor of the formula $SrLiAl_3N_4$:$Eu^{2+}$.

The inventors have recognized that it is possible to provide a novel phosphor having advantageous properties that it has not been possible to provide to date. More particularly, the phosphor has the tetragonal P4$_2$/m space group described here. The phosphor shows improved luminescence efficiency compared to nitridolithoaluminate phosphors known to date, for example SrLiAl$_3$N$_4$:Eu$^{2+}$ and CaLiAl$_3$N$_4$:Eu$^{2+}$. By comparison with SrLiAl$_3$N$_4$:Eu$^{2+}$ luminescence efficiency is about four times higher, and by comparison with CaLiAl$_3$N$_4$:Eu$^{2+}$ actually eight times higher, such that the phosphor described here has excellent usability in a conversion element of a lighting device.

In at least one embodiment, the conversion LED is used, for example, for general lighting, display backlighting, signage, in display panels, in automobiles or in numerous other consumer products.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the illumination apparatus. In the following description, various aspects are described with reference to the following drawings, in which:

FIGS. 6A to 6C show the crystallographic data in one embodiment;

FIGS. 7A to 8G show the simulated emission spectra and corresponding data for comparative examples and working examples;

DETAILED DESCRIPTION

Figure 1:
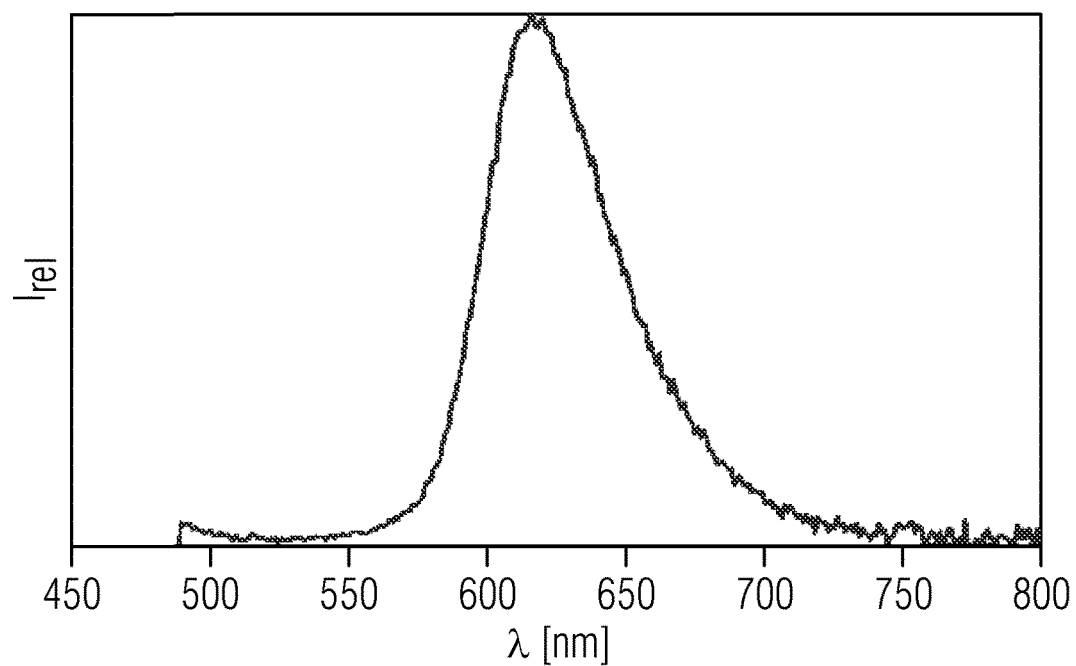
FIG. 1 shows an emission spectrum (bulk sample) in one embodiment.

In the working examples and figures, identical elements or elements of the same type or having the same effect may each be given the same reference numerals. The elements shown and their size ratios should not be regarded as being to scale. Instead, individual elements, for example layers, parts, components and regions, may be shown in oversized form for better representability and/or for better understanding.

The phosphor has the general formula (MB)Li$_{3-2x}$Al$_{1+2x}$O$_{4-4x}$N$_{4x}$:E where MB is selected from a group of divalent metals including magnesium, calcium, strontium, barium, zinc and combinations thereof. E is selected from a group including europium, manganese, cerium, ytterbium and combinations thereof. 0<x<0.875.

In particular, x=0.5, MB=strontium and E=europium, resulting in the working example B1 having the formula SrLi$_2$Al$_2$O$_2$N$_2$:Eu. Working example B1 can be produced by a solid-state reaction. For this purpose, the starting materials, such as strontium nitride, aluminum nitride, aluminum oxide, lithium nitride and europium nitride, may be blended in the ratios (table 1), molar amounts and/or weights stated hereinafter.

TABLE 1

| Starting materials | Molar amount n/mmol | Mass m/g |
|---|---|---|
| Sr$_3$N$_2$ | 15.26 | 4.438 |
| AlN | 30.83 | 1.264 |
| Al$_2$O$_3$ | 30.83 | 3.143 |
| Li$_3$N | 30.83 | 1.074 |
| Eu$_2$O$_3$ | 0.23 | 0.081 |

The starting materials may be mixed and introduced, for example, into a nickel crucible. Subsequently, they can be heated to a temperature of between 700° C. and 1000° C., such as a temperature of 750° C. to 850° C., for example 800° C. The heating can be effected in a stream of 7.5% hydrogen in nitrogen.

Subsequently, the temperature can be maintained over a period of 1 hour to 400 hours, for example 5 hours to 150 hours, for example 100 hours. The result is the phosphor of working example B1.

As an alternative to the process already described, the phosphor can also be prepared by solid-state synthesis of the starting materials listed in table 2 in the amounts specified by way of example. For this purpose, the starting materials can be introduced into a tantalum ampoule and heated at a heating rate of 180° C. per hour to 800° C., kept at 800° C. for 100 hours, then cooled a at cooling rate of 6° C. per hour to 500° C., and then, for example, the oven can be switched off so that the system cools down to room temperature.

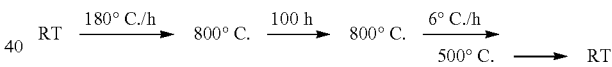

TABLE 2

| Starting materials | Mass m/mg |
|---|---|
| Sr$_3$Al$_2$O$_6$ | 97.34 |
| LiN$_3$ | 23.09 |
| Li (flux) | 16.37 |
| Eu$_2$O$_3$ | 0.83 |

FIG. 1 shows an emission spectrum of working example B1 as a bulk sample. What is shown is the relative intensity I$_{rel}$ depending on the wavelength λ in nm. The sample was excited with primary radiation at a wavelength of 460 nm. Working example B1 shows red emission. The emission spectrum shows a single peak with a small half-height width and a peak maximum of about 616 nm. The half-height width of the emission is less than 55 nm. The dominant wavelength is 605 nm and CIE-x: 0.644 and CIE-y: 0.352.

Owing to the short dominant wavelength in combination with the small half-height width and the associated good overlap with the human eye sensitivity curve, working example B1 has a high photometric radiation equivalent of 232 lm/W$_{OPT}$. This high efficiency, combined with the red color locus, in the case of use of working example B1 in a lighting device, leads to a highly efficient lighting device having very good color reproduction, especially for saturated red shades.

Figure 2:
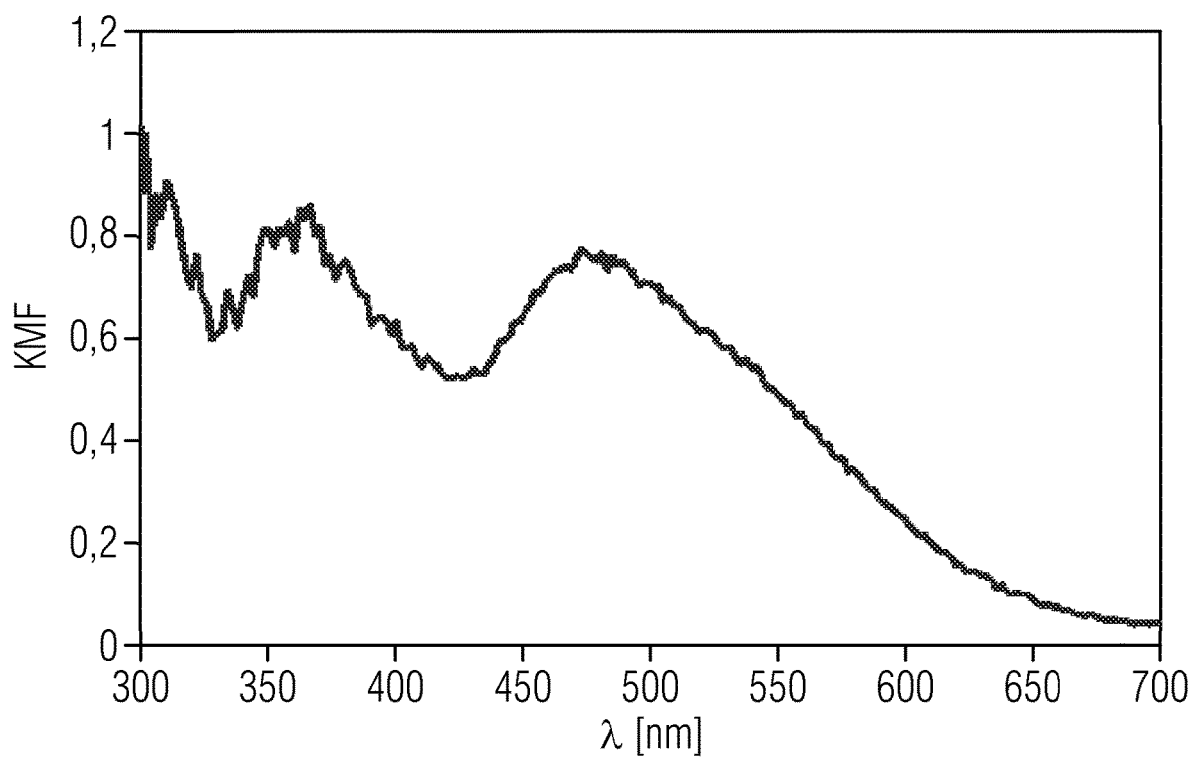
FIG. 2 shows the Kubelka-Munk function depending on the wavelength in one embodiment.

FIG. 2 shows the Kubelka-Munk function. What is shown is the normalized KMF (KMF=$(1-R_{inf})^2/2R_{inf}$) depending on the wavelength λ in nm of the first working example B1. The Kubelka-Munk function shows that working example B1 has absorption both in the UV region and in the blue and green spectral region. This means that the luminescence of working example B1 can be excited by means of UV, blue and green light, and so this working example B1 or the phosphor is of excellent usability for a conversion LED with blue primary radiation.

Figure 3:
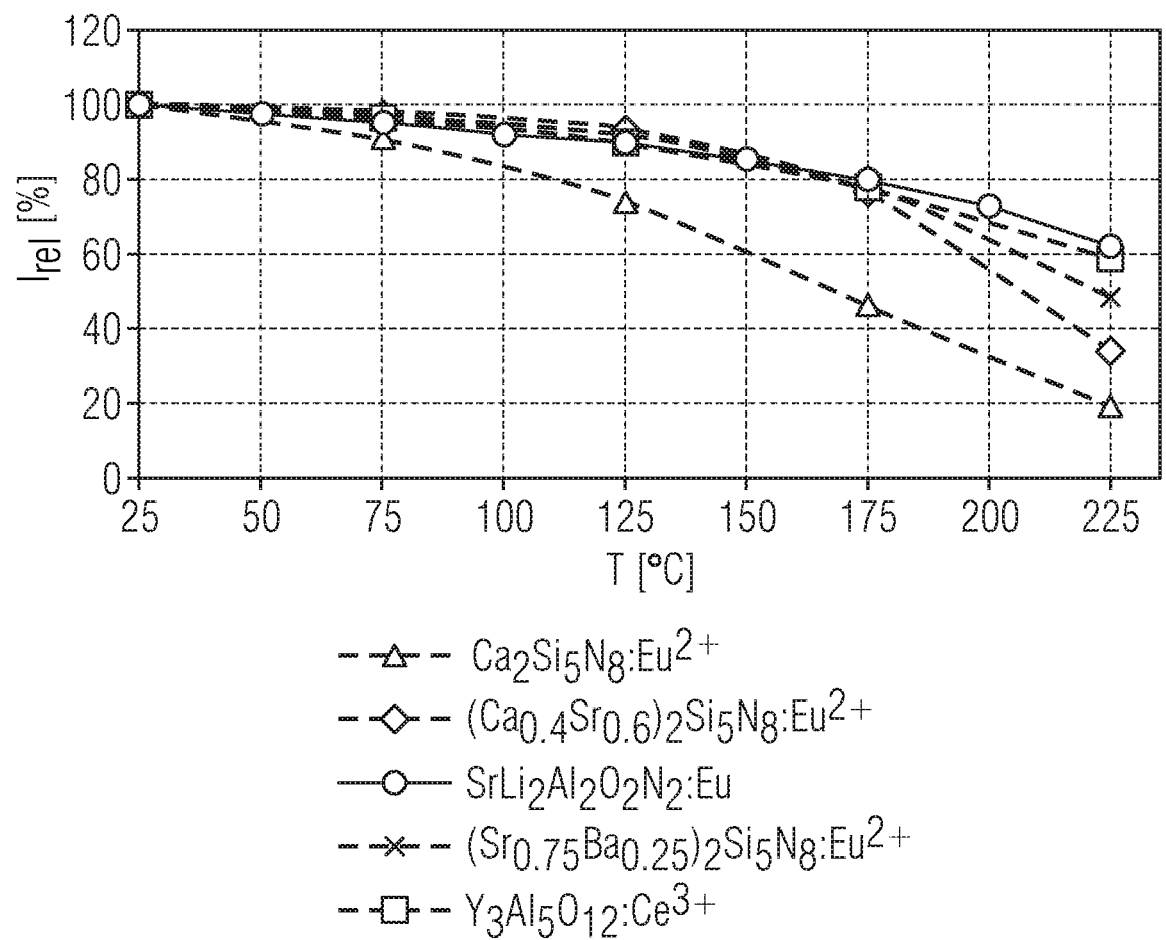
FIG. 3 shows the relative intensity depending on the temperature of comparative examples and working examples.

FIG. 3 shows the thermal quenching characteristics for working example B1 and other conventional phosphors. What is shown is the relative intensity $I_{rel}$ (based in each case on the intensity at 25° C.) depending on the temperature T in ° C. It is apparent from the curves that working example B1 is comparable to the thermal quenching of YAG:Ce, which is conventionally used for white conversion LEDs. At suitable temperatures, working example B1 actually shows better performance than the other red-emitting conventional phosphors, for example of the $M_2Si_5N_8$:Eu type.

Figure 4:
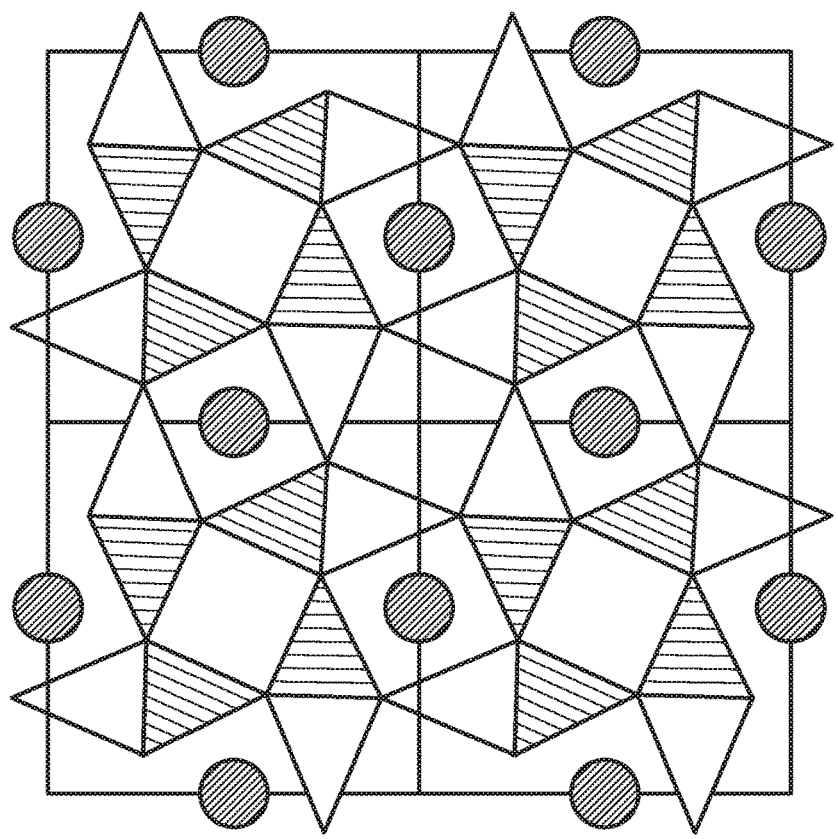
FIG. 4 shows the crystal structure in one embodiment.

FIG. 4 shows the crystal structure of working example B1, viewed along the crystallographic c axis. The black spheres are Sr, the white units $LiO_3N$ tetrahedra and the hatched units $AlON_3$ tetrahedra.

Single-crystal x-ray structure analysis on working example B1 shows that the new phosphor crystallizes in the tetragonal $P4_2/m$ space group. The crystal structure can be described as a superstructure of the $UCr_4C_4$ structure type. However, the phosphor crystallizes in a structure different than the $UCr_4C_4$ structure type. The Bravais lattices of these two structures are fundamentally different. The $UCr_4C_4$ structure can be described in the body-centered I4/m space group. Thus, it is possible to observe only those reflections that satisfy the condition h+k+l=2n, and so the sum total of the indices of the reflections is even. By comparison with the $UCr_4C_4$ type, there are no such conditions applicable to the primitive lattice of the working example described here. This leads to the existence of additional reflections, for example with the index 100 at about 11.11° 2θ for copper Kα1 radiation with an interplanar distance (d value) of about 7.96 Å. The different number of reflections is apparent from the different Bravais lattices.

Figure 5:
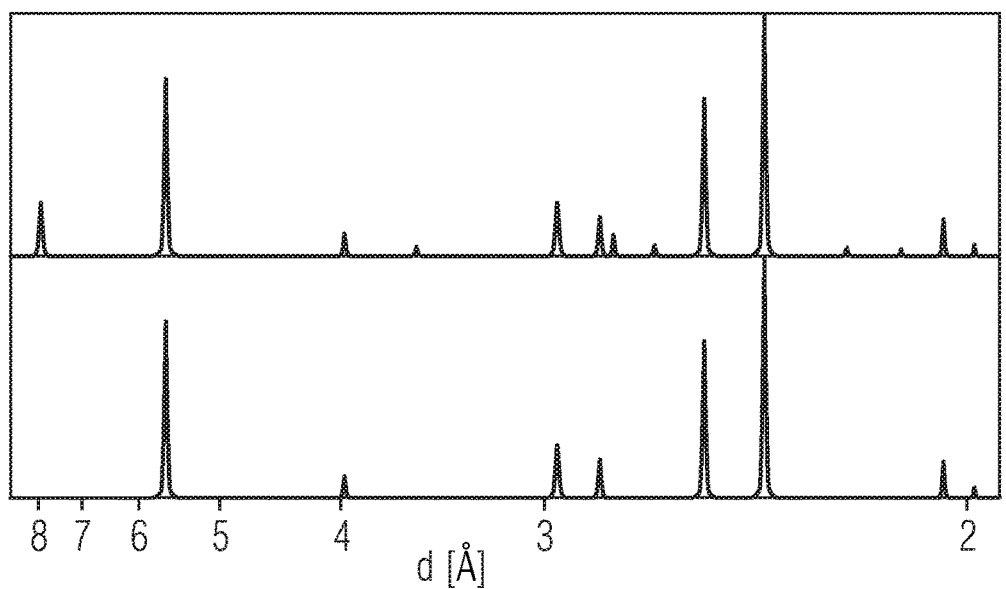
FIG. 5 shows simulated x-ray powder diffractograms in a comparative example and working example.

FIG. 5 shows a comparison of simulated powder x-ray diffractograms for working example B1 (upper image) with the $P4_2/m$ space group and a hypothetical $SrLi_2Al_2O_2N_2$ (lower image) with a crystal structure of the $UCr_4C_4$ type with the I4/m space group. What is shown is the interplanar distance in Å. It is apparent from the figure that the phosphor described here, using the example of working example B1 here, does not crystallize in the same space group as $UCr_4C_4$, but crystallizes in the tetragonal $P4_2/m$ space group. Working example B1 described here shows a reduction in symmetry that leads to a higher degree of freedom of the atomic positions. This leads to two nonequivalent crystallographic tetrahedral centers, by contrast with the $UCr_4C_4$ type, in which all tetrahedral centers are of equivalent symmetry.

In the inventive $SrLi_2Al_2O_2N_2$, it is possible to determine two types of tetrahedron: $LiO_3N$ and $AlN_3O$ tetrahedra. Each type of tetrahedron forms a column along the crystallographic c axis in that multiple tetrahedra share common corners. Sharing of the corners with other types of tetrahedra results in a three-dimensional tetrahedral network with three different channels in the crystallographic c direction (pure $LiO_3N$, pure $AlN_3O$ and mixed $(LiO_3N)_{0.5}(AlN_3O)_{0.5}$ channels). Only the channels surrounded by $LiO_3N$ and $AlN_3O$ tetrahedra are populated by strontium. Strontium is coordinated in the form of a slightly distorted $Sr(O_4,N_4)$ cube.

Working example B1 described shows a half-height width of less than 50 nm. By contrast, for the hypothetical $SrLi_2Al_2O_2N_2$ in the $UCr_4C_4$ type, a half-height width of greater than 70 nm is to be expected.

FIGS. 6A to 6C show the crystallographic data of working example B1. What are shown are the empirical formula F, the formula weight m, the crystal system C, the space group S, the unit cell volume $V_c$, the density d, the radiation R, the measurement range M, the number of reflections measured RT, the symmetry-independent reflections IR, the number of parameters NP, the population O. The crystal system C is tetragonal (tetr). The definition of the parameters a, c, T, Rint, R1, wR2, GooF, Uiso, U11 to U12 is known to those skilled in the art and will therefore not be elucidated further at this point.

FIG. 6B shows the atomic parameters of working example B1 and FIG. 6C the anisotropic deflection parameters of working example B1.

FIGS. 7A to 7D show the results of simulated LED spectra of working examples A1 to A10 and comparative examples. FIGS. 7A to 7D show a table of results that can also be referred to as FIG. 7. Owing to its dimensions, the table has been split into FIGS. 7A to 7D. The results labeled AX where X=1 to 10 show the working examples. The results labeled VX where X=1 to 7 show the comparative examples corresponding to the respective working examples AX.

It is observed that the working examples, by comparison with the corresponding comparative examples, have a higher photometric radiation equivalent (LER). The potential LER value is about 15% to 23% higher than in the case of the corresponding comparative example (cf., for example, rel. LER of A1 and V1).

The corresponding simulated total emission spectra of the working examples and comparative examples of FIGS. 7A to 7D are shown in FIGS. 8A to 8G.

FIGS. 8A to 8G each show the intensity I in arbitrary units a.u. depending on the wavelength λ in nm.

Figure 8A:
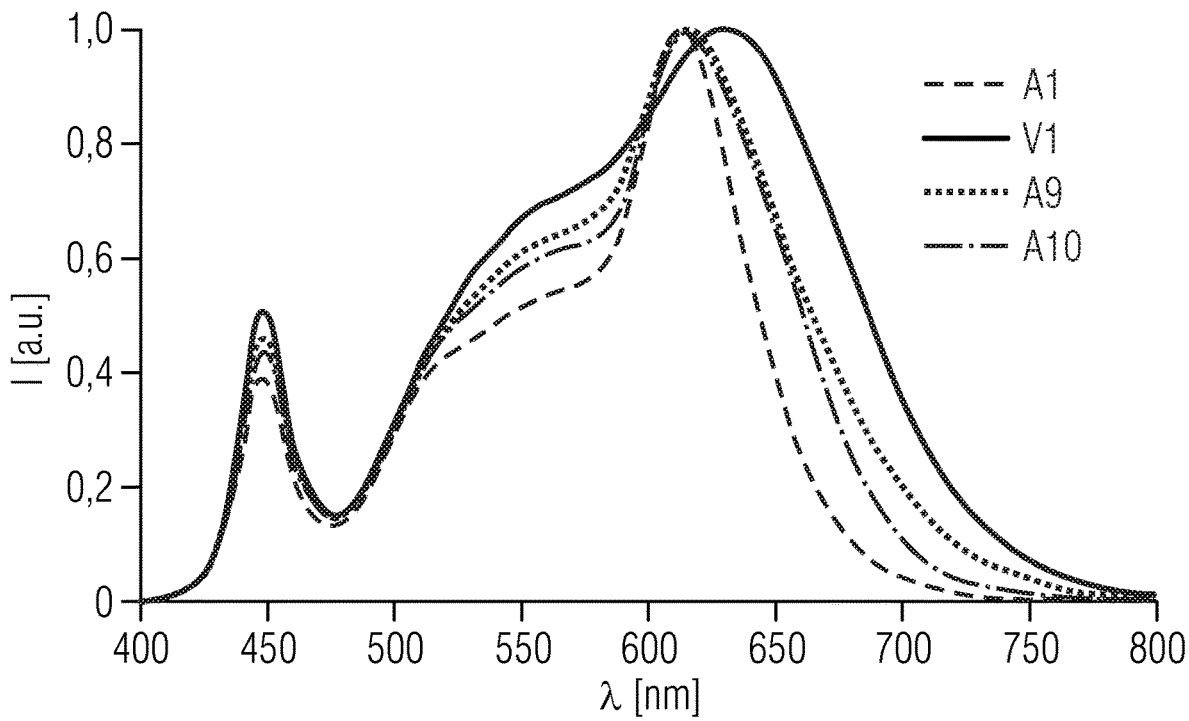

FIG. 8A shows the simulated emission spectra of working examples A1, A9, A10 and of comparative example V1.

Figure 8B:
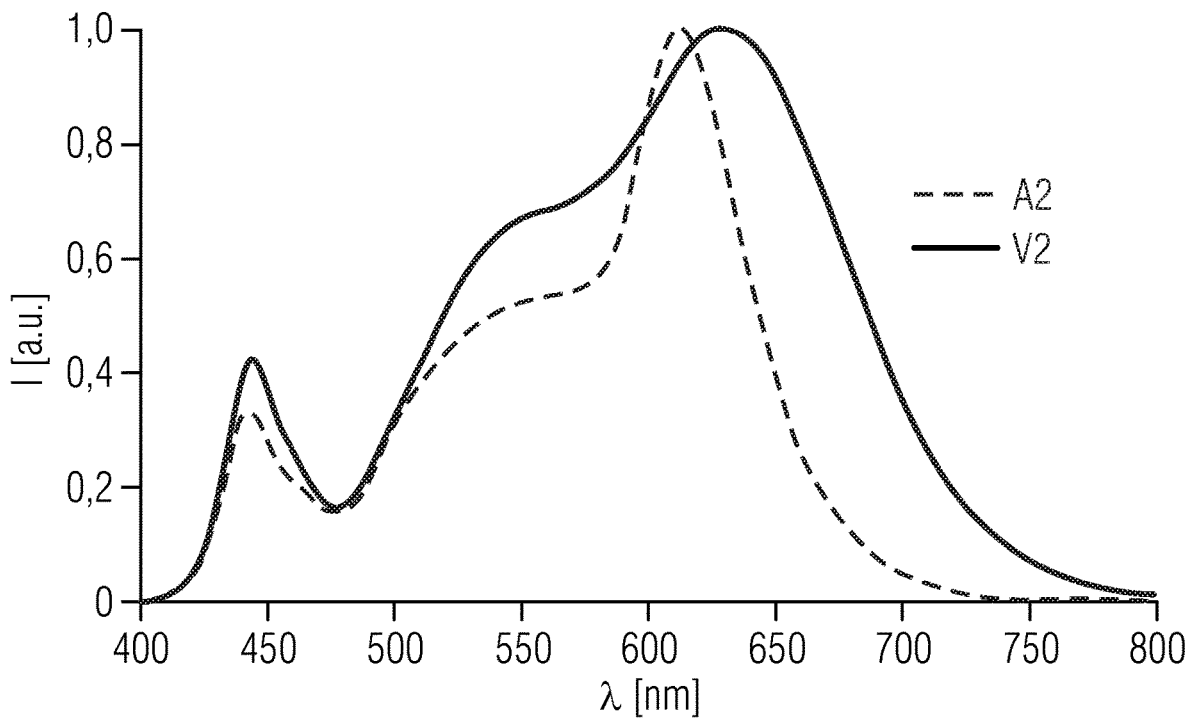

FIG. 8B shows the simulated emission spectra of working example A2 and of comparative example V2.

Figure 8C:
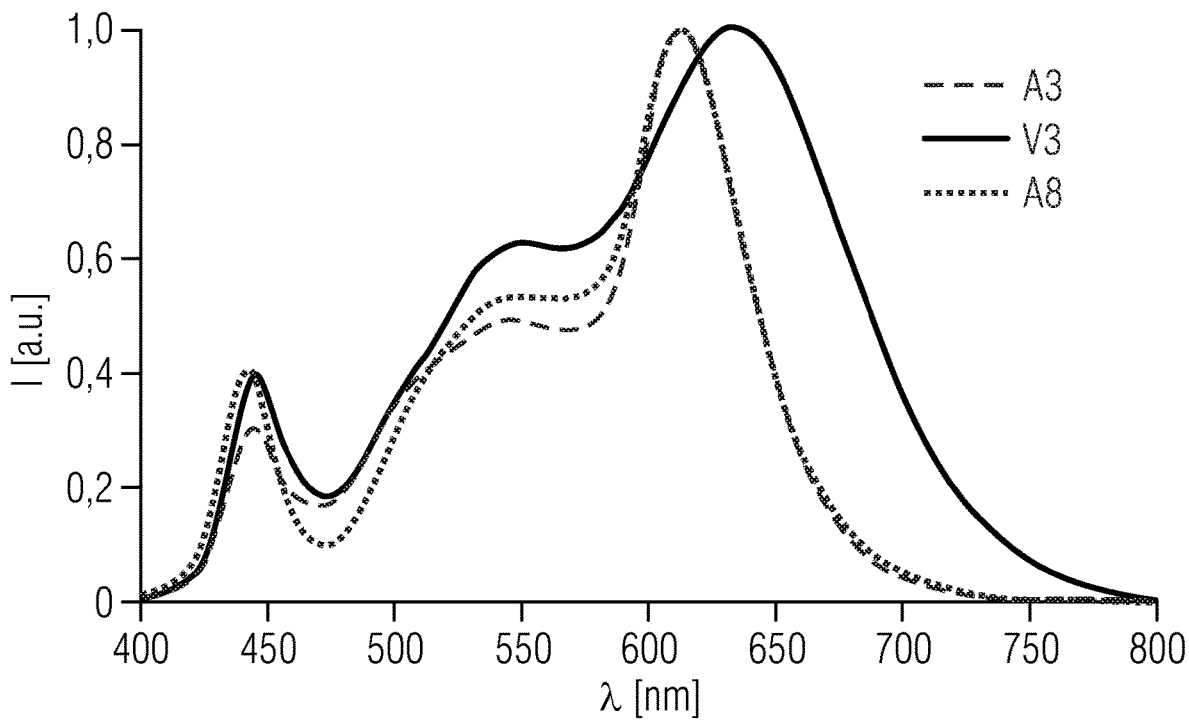

FIG. 8C shows the emission spectra of working example A3 and of comparative example V3, and of working example A8.

Figure 8D:
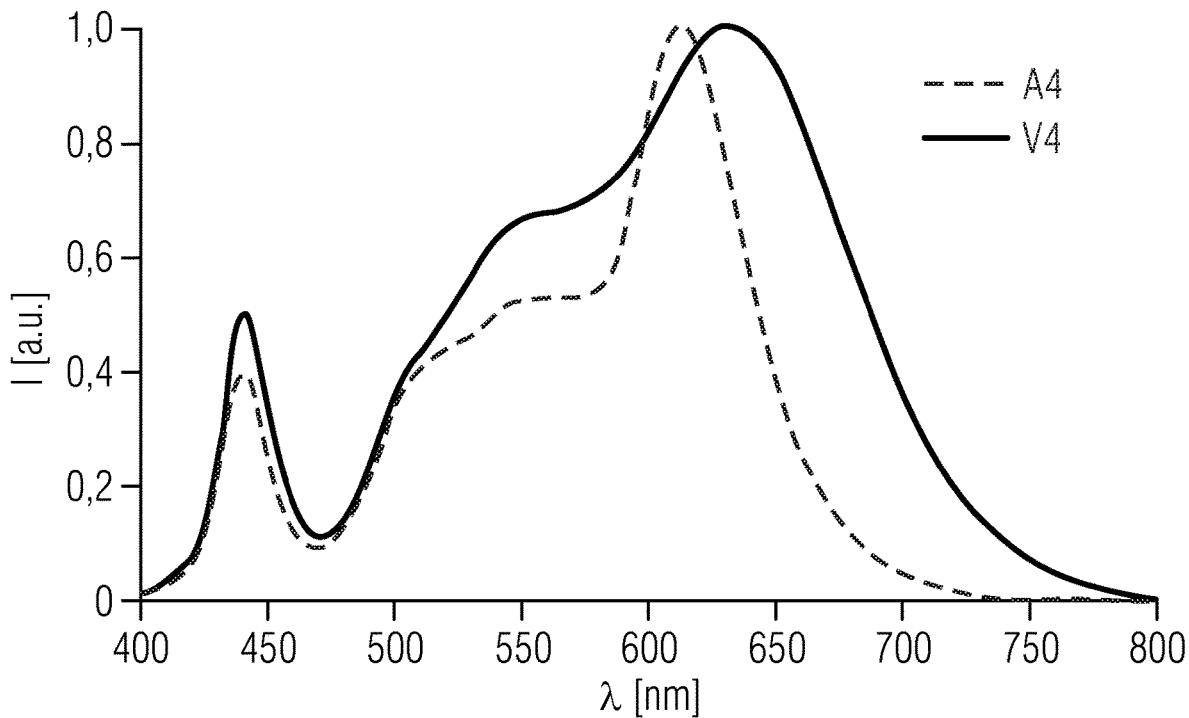

FIG. 8D shows the simulated emission spectra of working example A4 and of comparative example V4.

Figure 8E:
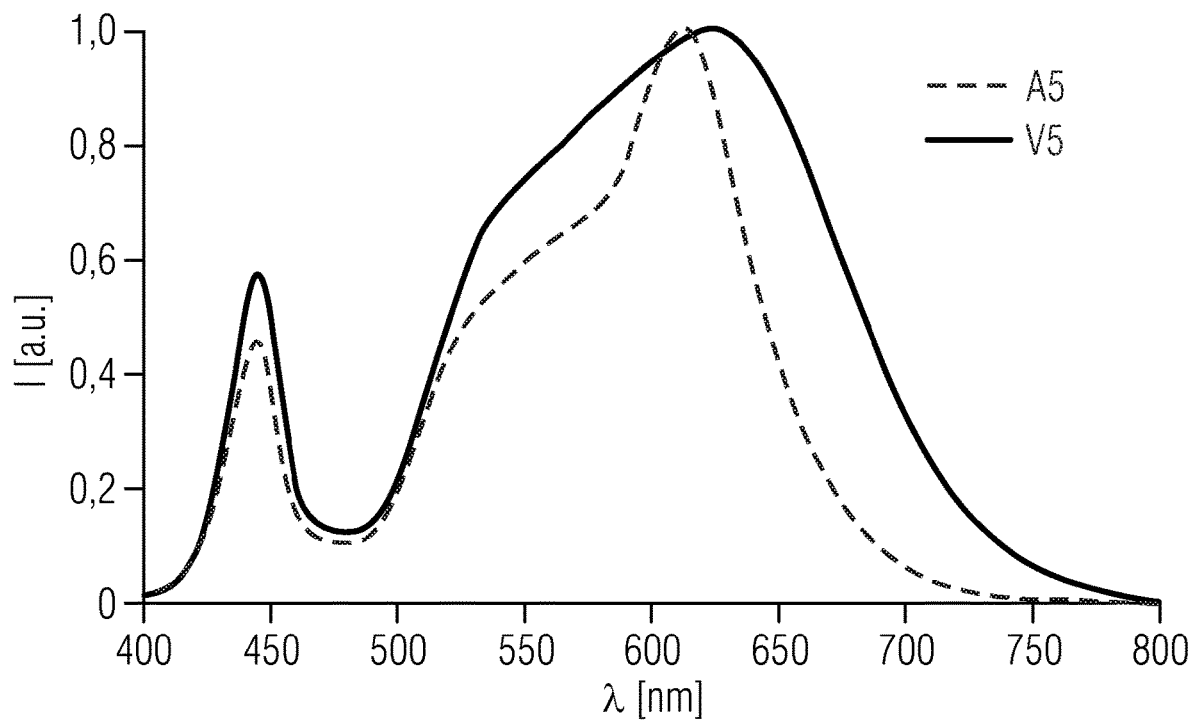

FIG. 8E shows the simulated emission spectra of working example A5 and of comparative example V5.

Figure 8F:
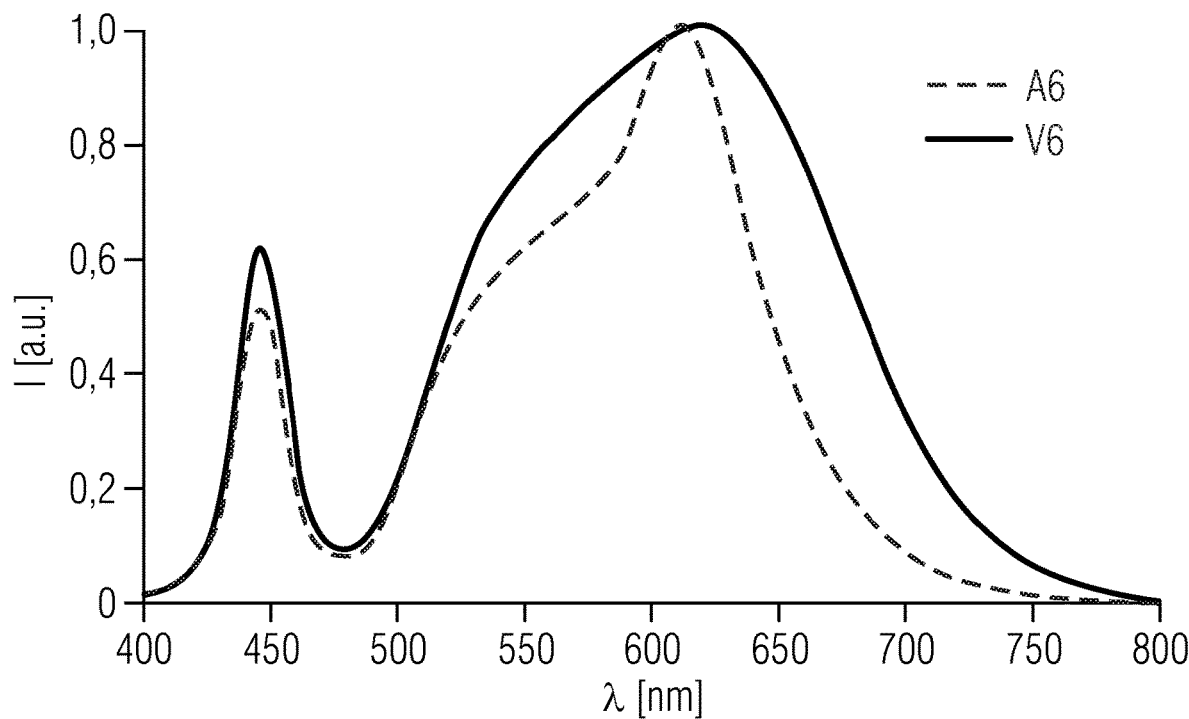

FIG. 8F shows the simulated emission spectra of working example A6 and of comparative example V6.

Figure 8G:
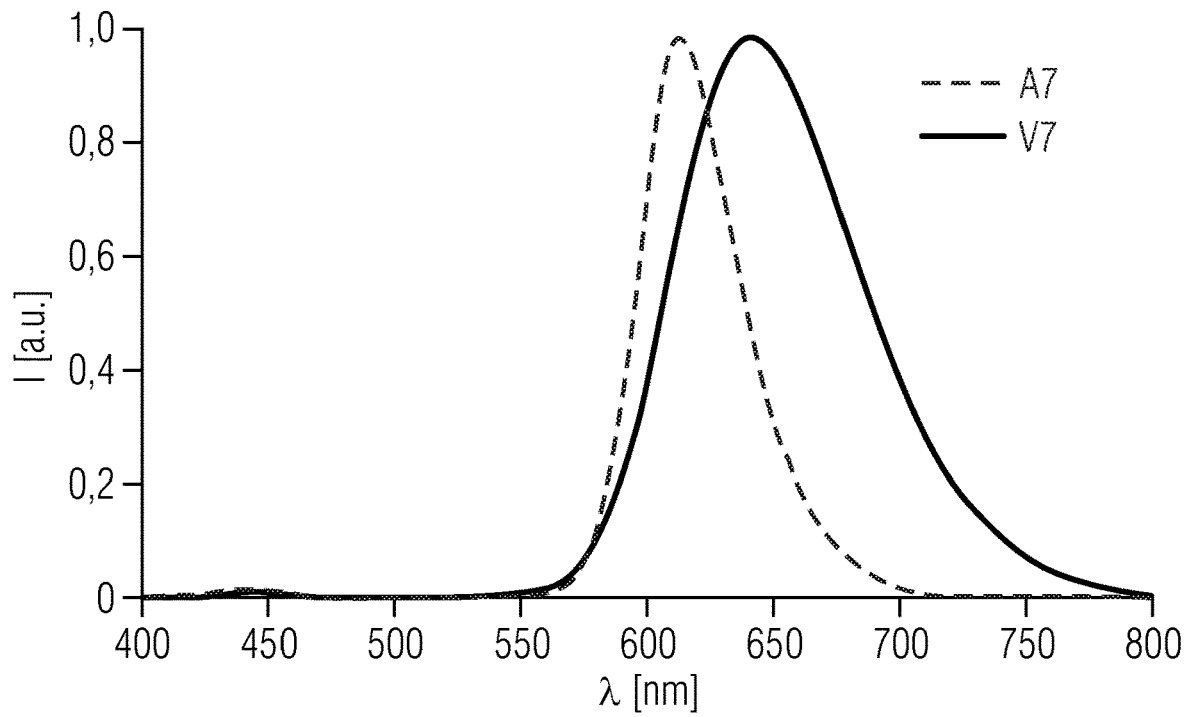

FIG. 8G shows the simulated emission spectra of working example A7 and of comparative example V7.

Examples A1 to A6 and A8 to A10 produce white light with a color temperature of 3000 K, whereas working example A7 shows red light via full conversion.

Working example A7, by comparison with comparative example V7, shows a relative LER value 105% higher.

Figure 8H:
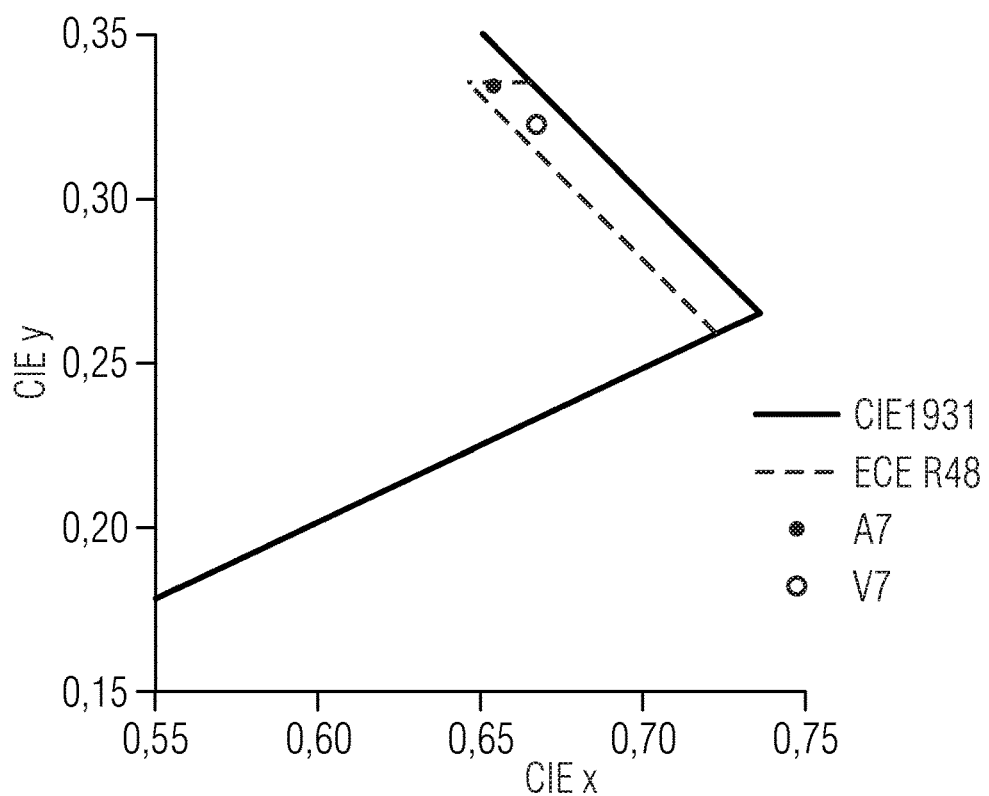
FIG. 8H shows color locus coordinates in a comparative example and working example.

The color locus coordinates of working example A7 and comparative example V7 are shown in FIG. 8H. It is apparent from FIG. 8H that both examples are in the orange-red ECE color range for automobile applications. The ECE regulation is ECE-R48.

The phosphor shows improved luminescence efficiency compared to conventional red-emitting phosphors, for example CaAlSiN$_3$:Eu or SrLiAl$_3$N$_4$:Eu.

The high colour, space coverage in backlighting devices in combination with the high luminescence efficiency is caused by the low half-height width of the phosphor. Moreover, the phosphor is producible at moderate temperatures, which enables inexpensive production.

By means of the simulated LED emission spectra shown in FIGS. 8A to 8H, it is possible to determine the potential efficiency (LER) in warm white LEDs. All simulations were conducted assuming an individually emitting semiconductor chip of wavelengths from the blue spectral region with a dominant wavelength between 448 nm and 453 nm. In addition, a combination of the green- to yellow-emitting garnet phosphor with working example B1 or conventional red-emitting phosphors, such as CaAlSiN$_3$:Eu, was used.

The emission spectra were simulated for two applications either with a color rendering index R$_A$ of greater than 90 at a color temperature of 3000 K or with an R$_A$ of greater than 80 at 3000 K. A color locus at CCT≈3000 K at or close to Planck's curve was used for all examples. In addition, conventional phosphors such as YAG:Ce and/or CaAlSiN$_3$:Eu were added to the mixture in order to improve the spectral properties for the application.

Working examples A8, A9 and A10 show this concept. Working example A8 is similar to working example A3, but additionally includes a yellow-emitting garnet phosphor (YAG:Ce). It is thus possible to adjust the CRI value and to increase the LER value for the warm white spectrum (+2%).

Working examples A9 and A10 are related to working example A1, except that these additionally include a red-emitting nitride phosphor (CaAlSiN$_3$:Eu and SrLiAl$_3$N$_4$:Eu).

In this example, the addition of the red-emitting nitride phosphor produces a change in the R9 value. Working examples A9 and A10 show R9 values of not less than 50, whereas working example A1 shows an R9 value of 20.

This concept is not restricted to the working examples shown here. More particularly, it is also possible to use a total of more than three phosphors, for example four, five, six or more. Moreover, this concept is not restricted to the addition of garnet phosphors and/or nitride phosphors; instead, it is also possible to use any of the phosphors known to those skilled in the art to optimize the emission bands.

In addition, working example A7 and comparative example V7 show full conversion, and the lighting device, especially a light-emitting diode, has an orange-red overall emission spectrum. Working example A7 was simulated with working example B1, and comparative example V7 with CaAlSiN$_3$:Eu. The target color locus within the ECE-R48 color box was chosen for all examples.

Figure 9:
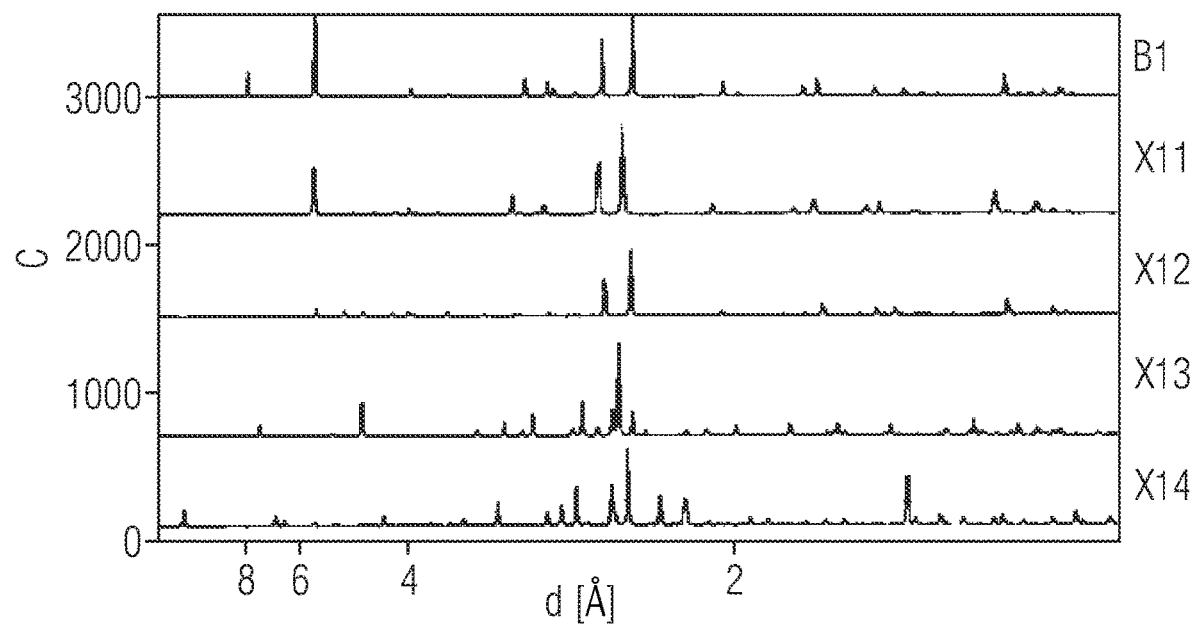
FIGS. 9 and 10 show x-ray powder diffractograms of comparative examples and working examples.

FIG. 9 shows simulated x-ray powder diffractograms of a working example B1 and of comparative examples X11 to X14. X11=SrLiAl$_3$N$_4$, X12=CaLiAl$_3$N$_4$, X13=Sr$_4$LiAl$_{11}$N$_4$ and X14=Ca$_{18.75}$Li$_{10.5}$Al$_{39}$N$_{55}$.

What is shown is the diffraction intensity (counts, C) on the y axis depending on the interplanar distance d in Å on the x axis.

The phosphor shows a different crystal structure and hence a different reflection pattern in the x-ray powder diffractogram than comparative examples X11 to X14.

The new red-emitting phosphor shows an improved luminous efficiency (V$_s$; V$_s$=LER/683 lm/W) compared to comparative examples X11-X14 as a result of a significant blue shift in the emission band and the small half-height width FWHM of the emission band.

In relation to comparative example X11, the luminous efficiency (V$_s$) is greater by a factor of 4 (39% compared to 10%), and so this phosphor has excellent usability for conversion elements for conversion LEDs.

Compared to comparative example X12, the phosphor thus has a luminous efficiency (V$_s$) at least eight times higher.

Figure 10:
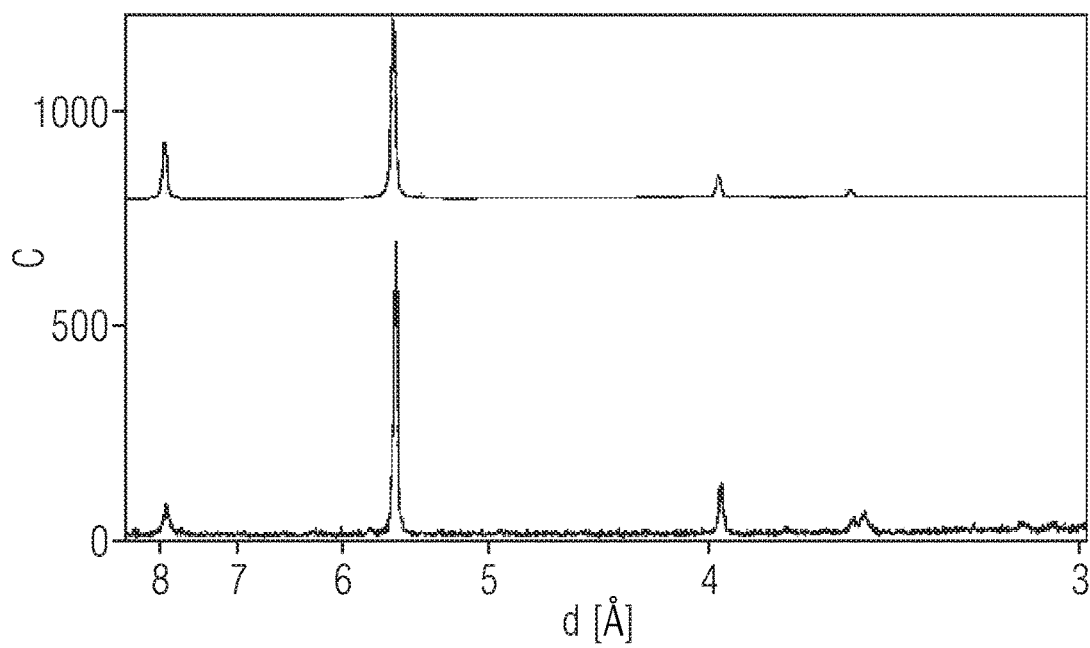

FIG. 10 shows a comparison of powder diffractograms of the new phosphor (the upper image is the simulation from the crystallographic data of the single-crystal structure determination; the lower figure is the experimental curve).

What is shown is the diffraction intensity (counts, C) depending on the interplanar distance (d value) of working example B1. The simulated and experimental curves show excellent agreement, and so the phosphor described here, using the example of working example B1, crystallizes in the tetragonal P4$_2$/m space group.

Figure 11:
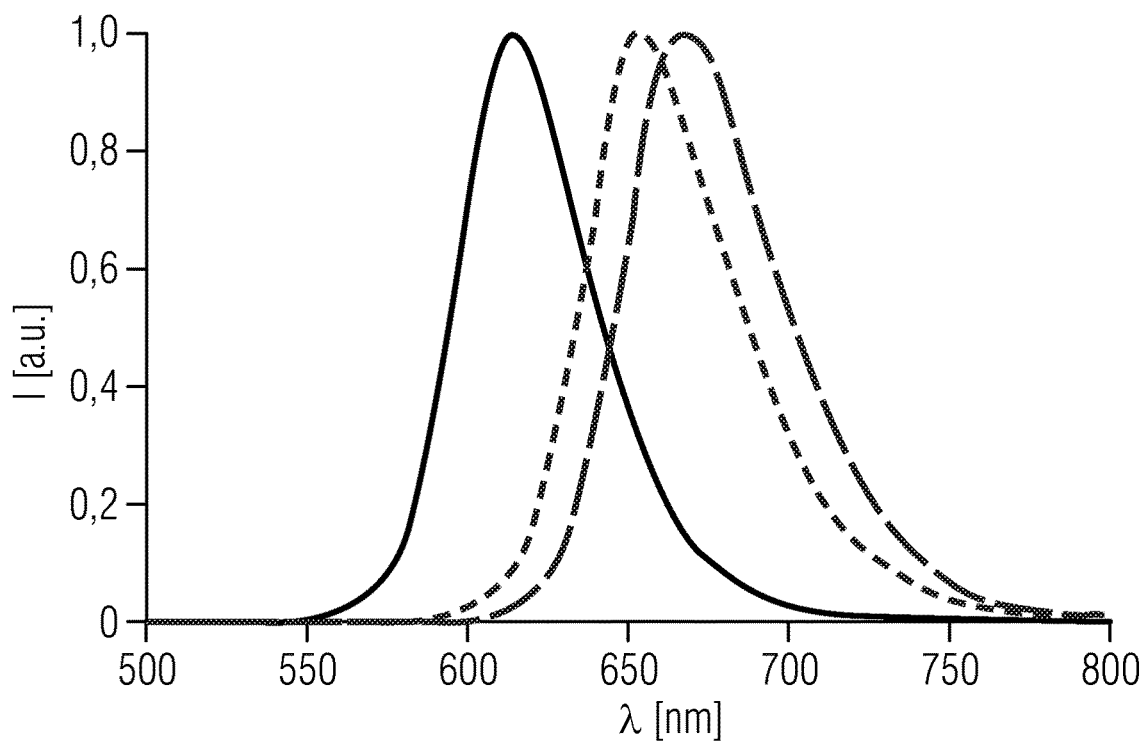
FIG. 11 shows emission bands of comparative examples and working examples.

FIG. 11 shows emission spectra of comparative example and a working example L1. What is shown is the intensity I depending on the wavelength λ in nm. The solid line shows the new phosphor with an excitation wavelength of 460 nm (B1—powder sample of compound SrLi$_2$Al$_2$N$_2$O$_2$; L1—single grain of compound SrLi$_2$Al$_2$N$_2$O$_2$). The short-dashed curve shows the comparative example SrLiAl$_3$N$_4$:Eu$^{2+}$, and the long-dashed curve shows the comparative example CaLiAl$_3$N$_4$:Eu$_{2+}$.

Table 3 below shows the corresponding data, where λ$_{dom}$ represents the dominant wavelength, λ$_{max}$ the peak wavelength, x and y the color locus, E the luminous efficiency Vs, and FWHM the half-height width.

TABLE 3

| | λ$_{dom}$/nm | λ$_{max}$/nm | x; y | E/V$_s$ | FWHM/nm |
|---|---|---|---|---|---|
| L1 | 606 | 614 | 0.651; 0.349 | 39% | 48 |
| SrLiAl$_3$N$_4$: Eu$^{2+}$ | 632 | ~650 | 0.706; 0.294 | ~10% | ~50 |
| SrLiAl$_3$N$_4$: Eu$^{2+}$ * | ~630 | ~654 | 0.711; 0.289 | <10% | ~50 |
| CaLiAl$_3$N$_4$: Eu$^{2+}$ | | ~670 | 0.720; 0.280 | | ~60 |
| CaLiAl$_3$N$_4$: Eu$^{2+}$ * | ~640 | ~670 | 0.721; 0.279 | <5% | ~60 |
| Sr$_4$LiAlnN$_{14}$: Eu$^{2+}$ | 624 | ~670 | 0.698; 0.301 | <10% | ~85 |
| Ca$_{18.75}$Li$_{10.5}$Al$_{39}$N$_{55}$: Eu$^{2+}$ | | ~645 | 0.699; 0.300 | ~15% | 58 |

* Data were estimated using the original publication.

FIG. 11 and table 3 show clearly that the inventors have succeeded in providing a phosphor, where the emission of comparative examples X11 and X12, maintaining the narrow-band emission, has been shifted to a shorter wavelength. This has an associated dramatic effect on the efficiency of the new phosphor compared to X11 and X12 with retention of emission in the red spectral region.

Figure 12:
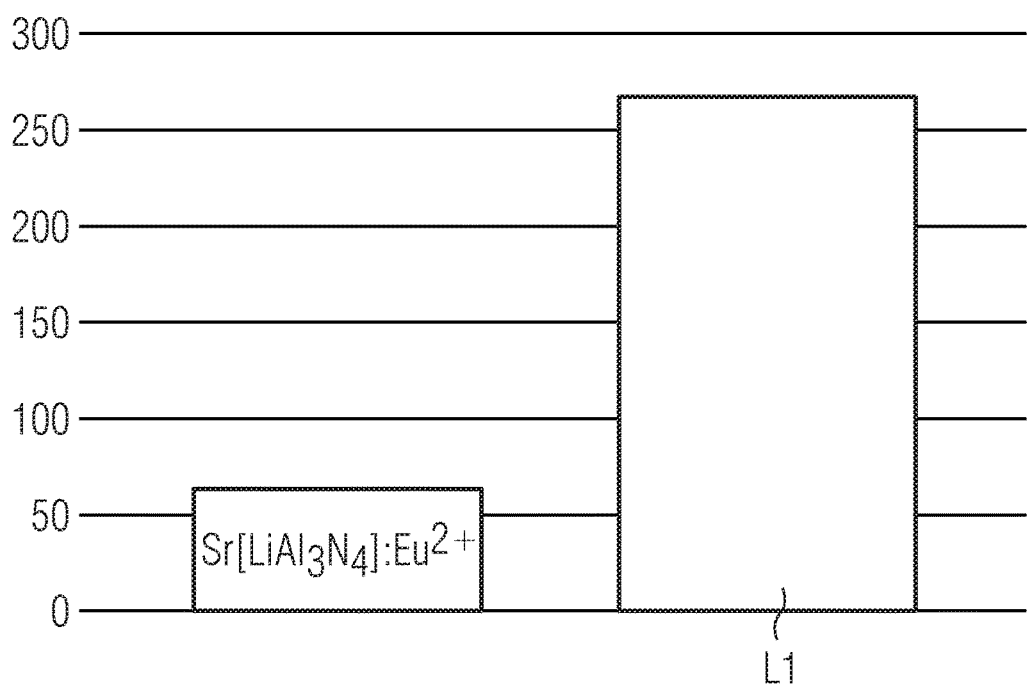
FIG. 12 shows the photometric radiation equivalent of a comparative example and working example.

FIG. 12 shows the photometric radiation equivalent (LER) of the inventive phosphor L1 and of comparative example Sr[LiAl$_3$N$_4$]:Eu$^{2+}$. What is shown on the y axis is the LER in lm/W$_{opt}$. It is apparent that the novel phosphor is about four times as efficient as the comparative example Sr[LiAl$_3$N$_4$]:Eu$^{2+}$.

Figure 13:
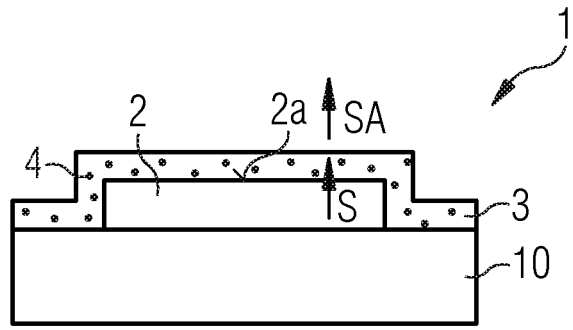
FIGS. 13 to 15 each show a schematic side view of a lighting device in one embodiment.
Figure 14:
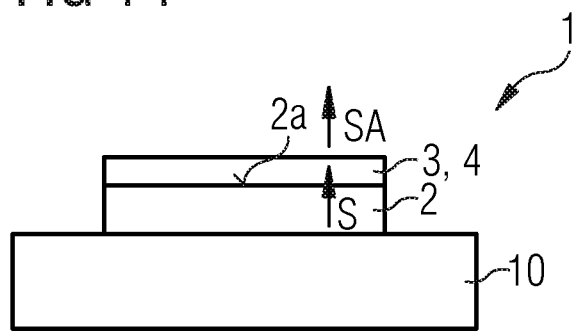
Figure 15:
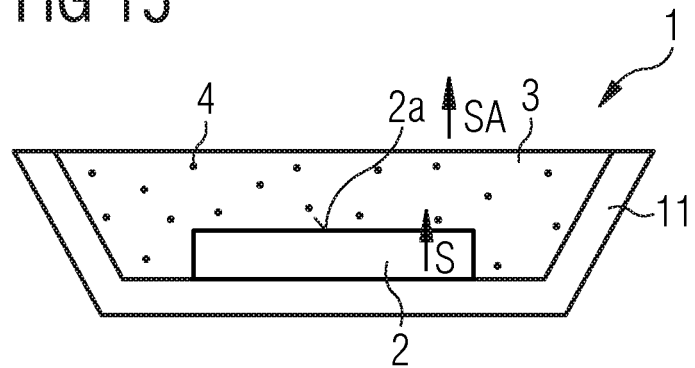

FIGS. 13 to 15 each show schematic side views of different embodiments of lighting devices described here, especially conversion LEDs.

The conversion LEDs of FIGS. 13 to 15 include at least one phosphor. In addition, one further phosphor or a combination of phosphors may be present in the conversion LED. The additional phosphors are known to those skilled in the art and are therefore not mentioned explicitly at this point.

The conversion LED according to FIG. 13 has a semiconductor layer sequence 2 disposed atop a substrate 10. The substrate 10 may, for example, be in reflective form. Disposed atop the semiconductor layer sequence 2 is a conversion element 3 in the form of a layer. The semiconductor layer sequence 2 has an active layer (not shown) which, in the operation of the conversion LED, emits primary radiation with a wavelength of 300 nm to 500 nm. The conversion element 3 is disposed in the beam path of the primary radiation S. The conversion element 3 includes a matrix material, for example a silicone, epoxy resin or hybrid material, and particles of the inventive phosphor 4.

For example, the phosphor 4 has an average particle size of 10 µm. The phosphor 4 is capable of converting the primary radiation S in the course of operation of the conversion LED at least partly or fully to a secondary radiation SA in the red spectral region. In the conversion element 3, the phosphor 4 is distributed homogeneously in the matrix material within the scope of manufacturing tolerance.

Alternatively, the phosphor 4 may also be distributed in the matrix material with a concentration gradient.

Alternatively, the matrix material may also be absent, such that the phosphor 4 takes the form of a ceramic converter.

The conversion element 3 has been applied over the full area of the radiation exit face 2a of the semiconductor layer sequence 2 and the side faces of the semiconductor layer sequence 2, and is in direct mechanical contact with the radiation exit face 2a of the semiconductor layer sequence 2 and the side faces of the semiconductor layer sequence 2. The primary radiation S can also exit via the side faces of the semiconductor layer sequence 2.

The conversion element 3 may be applied, for example, by injection molding, injection compression molding or spray coating methods. In addition, the conversion LED has electrical contacts (not shown here), the formation and arrangement of which is known to those skilled in the art.

Alternatively, the conversion element may also have been prefabricated and may be applied to the semiconductor layer sequence 2 by means of a "pick-and-place" process.

FIG. 14 shows a further working example of a conversion LED 1. The conversion LED 1 has a semiconductor layer sequence 2 atop a substrate 10. The conversion element 3 has been formed atop the semiconductor layer sequence 2. The conversion element 3 takes the form of a platelet. The platelet may consist of particles of the inventive phosphor 4 that have been sintered together and hence be a ceramic platelet, or the platelet includes, for example, glass, silicone, an epoxy resin, a polysilazane, a polymethacrylate or a polycarbonate as matrix material with particles of the phosphor 4 embedded therein.

The conversion element 3 has been applied over the full area of the radiation exit face 2a of the semiconductor layer sequence 2. More particularly no primary radiation S exits via the side faces of the semiconductor layer sequence 2, and it exits predominantly via the radiation exit face 2a. The conversion element 3 may have been applied atop the semiconductor layer sequence 2 by means of a bonding layer (not shown), for example composed of silicone.

The conversion LED 1 according to FIG. 15 has a housing 11 with a recess. A semiconductor layer sequence 2 having an active layer (not shown) is disposed within the recess. In the operation of the conversion LED, the active layer emits a primary radiation S having a wavelength of 300 nm to 460 nm.

The conversion element 3 takes the form of an encapsulation of the layer sequence in the recess and includes a matrix material, for example a silicone, and a phosphor 4, for example SrLi$_2$Al$_2$N$_2$O$_2$:Eu. The phosphor 4 converts the primary radiation S in the operation of the conversion LED 1 at least partly to a secondary radiation SA. Alternatively, the phosphor converts the primary radiation S fully to secondary radiation SA.

It is also possible that the phosphor 4 in the working examples of FIGS. 13 to 15 in the conversion element 3 is spaced apart from the semiconductor layer sequence 2 or the radiation exit face 2a. This can be achieved, for example, by sedimentation or by applying the conversion layer atop the housing.

For example, by contrast with the embodiment of FIG. 15, the encapsulation may consist solely of a matrix material, for example silicone, with application, atop the encapsulation, spaced apart from the semiconductor layer sequence 2, of the conversion element 3 as a layer atop the housing 11 and atop the encapsulation.

The working examples and their features that have been described in conjunction with the figures may, in further working examples, also be combined with one another, even though such combinations are not shown explicitly in the figures. In addition, the working examples described in connection with the figures may have additional or alternative features according to the description in the general part.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes that come within the meaning and range of equivalency of the claims are therefore intended to be embraced.

LIST OF REFERENCE NUMERALS 1 lighting device or conversion LED
2 semiconductor layer sequence or semiconductor chip
2a radiation exit face
3 conversion element
4 phosphor
10 substrate
11 housing
S primary radiation
SA secondary radiation
CCT correlated color temperature
CRI color rendering index
LED light-emitting diode
LER light yield
W watts
lm lumens
$\lambda_{dom}$, $\lambda_d$ dominant wavelength
$\lambda_{peak}$, $\lambda_p$ peak wavelength
ppm parts per million
R9 color rendering index
d distance
L,L1;L2 . . . phosphor

The invention claimed is:

1. A phosphor having the formula $(MB)Li_2Al_2O_2N_2$:E where MB is selected from a group of divalent metals consisting of Mg, Ca, Sr, Ba, Zn, and combinations thereof; and wherein E is selected from a group consisting of Eu, Mn, Ce, Yb, and combinations thereof.

2. The phosphor as claimed in claim 1, which emits electromagnetic radiation in the red spectral region.

3. The phosphor as claimed in claim 1, which has an emission spectrum having a maximum peak wavelength of 614 nm+/−10 nm and/or a half-height width of less than 60 nm.

4. The phosphor as claimed in claim 3, wherein the half-height width is less than 55 nm.

5. The phosphor as claimed in claim 1, wherein the phosphor does not crystallize in the crystal structure of the $UCr_4C_4$ type.

6. The phosphor as claimed in claim 1, wherein MB is Ca, Sr, Ba, or a combination thereof.

7. The phosphor as claimed in claim 1, wherein MB is Sr.

8. The phosphor as claimed in claim 1, wherein E is Eu.

9. The phosphor as claimed in claim 1, wherein the phosphor is excitable at least with radiation from the UV and/or blue spectral region.

10. A lighting device comprising a phosphor as claimed in claim 1.

11. The lighting device as claimed in claim 10 further comprising:
a semiconductor layer sequence set up to emit electromagnetic primary radiation; and
a conversion element which comprises the phosphor and at least partly converts the electromagnetic primary radiation to electromagnetic secondary radiation.

12. The lighting device as claimed in claim 11, wherein the phosphor fully converts the electromagnetic primary radiation to electromagnetic secondary radiation, such that the overall radiation from the lighting device is selected from the red wavelength range.

13. The lighting device as claimed in claim 11, wherein the conversion element comprises a second phosphor configured to emit radiation from the green spectral region, and a third phosphor configured to emit radiation from the red spectral region.

14. The lighting device as claimed in claim 11, in the form of a lamp for a motor vehicle.

15. The lighting device as claimed in claim 11, wherein the overall radiation from the lighting device is white mixed radiation.

16. A method for backlighting of display devices comprising the lighting device of claim 11.

17. The phosphor as claimed in claim 1, wherein the phosphor crystallizes in the tetragonal $P4_2/m$ space group.

18. The phosphor as claimed in claim 1, wherein MB is Sr and E is Eu such that the phosphor has the formula $SrLi_2Al_2O_2N_2$:Eu.

* * * * *